United States Patent
Lim et al.

(10) Patent No.: US 12,230,356 B2
(45) Date of Patent: Feb. 18, 2025

(54) MEMORY DEVICE, MEMORY SYSTEM, AND OPERATING METHOD OF MEMORY SYSTEM

(71) Applicant: Samsung Electronics Co., Ltd., Suwon-si (KR)

(72) Inventors: Sun Young Lim, Suwon-si (KR); Seung Yong Shin, Suwon-si (KR); Hyun Duk Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/384,973

(22) Filed: Oct. 30, 2023

(65) Prior Publication Data

US 2024/0062790 A1    Feb. 22, 2024

Related U.S. Application Data

(63) Continuation of application No. 17/409,064, filed on Aug. 23, 2021, now Pat. No. 11,837,317.

(30) Foreign Application Priority Data

Dec. 2, 2020    (KR) .................. 10-2020-0166312

(51) Int. Cl.
   *G11C 7/10*      (2006.01)
   *G11C 7/22*      (2006.01)
(52) U.S. Cl.
   CPC .......... *G11C 7/1063* (2013.01); *G11C 7/1057* (2013.01); *G11C 7/1084* (2013.01); *G11C 7/222* (2013.01)

(58) Field of Classification Search
   CPC ................. G11C 7/1063; G11C 7/10
   USPC .................................. 365/198.05
   See application file for complete search history.

(56) References Cited

U.S. PATENT DOCUMENTS

| | | |
|---|---|---|
| 7,450,426 B2 | 11/2008 | Li et al. |
| 7,782,683 B2 | 8/2010 | Sohn et al. |
| 7,787,297 B2 | 8/2010 | Jeon et al. |
| 8,117,587 B1 * | 2/2012 | Testardi .............. G06F 11/3664 717/100 |
| 9,053,014 B2 | 6/2015 | Huffman et al. |
| 9,123,409 B2 | 9/2015 | Eilert et al. |
| 9,507,704 B2 | 11/2016 | Tuers et al. |
| 9,779,804 B2 | 10/2017 | Oh et al. |

(Continued)

FOREIGN PATENT DOCUMENTS

KR    101159400 B1    6/2012

*Primary Examiner* — Muna A Techane
(74) *Attorney, Agent, or Firm* — Muir Patent Law, PLLC

(57) ABSTRACT

A memory device including a plurality of nonvolatile memory chips each including a status output pin and a buffer chip configured to receive a plurality of internal state signals, which indicate states of the plurality of nonvolatile memory chips, from the status output pins and output an external state signal having a set period on the basis of the internal state signals indicating a particular state, wherein in a first section of the external state signal having the set period, a duty cycle of the external state signal determines depending on an identification (ID) of the nonvolatile memory chip which outputs the internal state signal indicating the particular state among the plurality of nonvolatile memory chips.

20 Claims, 10 Drawing Sheets

(56) References Cited

U.S. PATENT DOCUMENTS 10,222,989 B1 * 3/2019 Zitlaw .................... G06F 3/061
11,003,382 B2 * 5/2021 Woo ...................... G06F 3/0679

* cited by examiner

MEMORY DEVICE, MEMORY SYSTEM, AND OPERATING METHOD OF MEMORY SYSTEM This application is a Continuation of U.S. patent application Ser. No. 17/409,064 filed on Aug. 23, 2021, now Allowed, which claims priority under 35 U.S.C. § 119 to Korean Patent Application No. 10-2020-0166312 filed on Dec. 2, 2020 in the Korean Intellectual Property Office, the disclosure of each of which is incorporated herein by reference in its entirety.

BACKGROUND

1. Field of the Disclosure

The present disclosure relates to a memory device, a memory system, and an operating method of the memory system.

2. Description of the Related Art

With the development of semiconductor technologies, there is an increasing trend of storage devices, such as a solid state drive (SSD), which employs a nonvolatile memory, such as a flash memory (e.g., a NAND-type flash memory), instead of a magnetic disk as a data storage device, being used in computer systems and portable devices.

In general, a storage device includes a plurality of nonvolatile memories. Accordingly, there is a necessity for a method for efficiently controlling a plurality of nonvolatile memories.

SUMMARY

The present disclosure provides a memory device and a memory system for reading the state of a nonvolatile memory chip without command overhead caused by a status read command and an operating method of the memory system.

The present disclosure provides a memory device including a plurality of nonvolatile memory chips each including a status output pin; and a buffer chip configured to receive a plurality of internal state signals, which indicate states of the plurality of nonvolatile memory chips, from the status output pins and output an external state signal having a set period on the basis of the internal state signals indicating a particular state, wherein in a first section of the external state signal having the set period, a duty cycle of the external state signal determines depending on an identification (ID) of the nonvolatile memory chip which outputs the internal state signal indicating the particular state among the plurality of nonvolatile memory chips.

The present disclosure provides a memory system including a plurality of nonvolatile memory chips each including a status output pin; a memory controller configured to control the plurality of nonvolatile memory chips and including a first pin; and a buffer chip connected between the plurality of nonvolatile memory chips and the memory controller and including a second pin configured to output an external state signal to the first pin and a third pin configured to receive a plurality of internal state signals, which indicate states of the plurality of nonvolatile memory chips, from the status output pins, wherein the buffer chip determines a duty cycle of the external state signal on the basis of the plurality of internal state signals and outputs the external state signal, and the memory controller does not provide a status read command to the plurality of nonvolatile memory chips on the basis of the external state signal and provides an input/output command to at least one of the plurality of nonvolatile memory chips.

The present disclosure provides a memory system including a plurality of nonvolatile memory chips each including a status output pin; a memory controller configured to control the plurality of nonvolatile memory chips; and a buffer chip connected between the plurality of nonvolatile memory chips and the memory controller, configured to receive a plurality of internal state signals, which indicate states of the plurality of nonvolatile memory chips, from the status output pins, and configured to output an external state signal every set period on the basis of the internal state signal indicating a particular state among the plurality of internal state signals, wherein the set period of the external state signal includes a first section having a first logic level and a second section having a second logic level, and the memory controller is configured to: receive the external state signal from the buffer chip; not provide a status read command to the plurality of nonvolatile memory chips and provide a read command to at least one of the plurality of nonvolatile memory chips through the buffer chip on the basis of a length of the first section included in the external state signal; and receive data read from at least one of the nonvolatile memory chips which receives the read command through the buffer chip.

The present disclosure provides an operating method of a memory system including receiving, by a buffer chip, a plurality of internal state signals, which indicate states of a plurality of nonvolatile memory chips, from the plurality of nonvolatile memory chips; and outputting, by the buffer chip, one external state signal having a set period to a memory controller on the basis of the plurality of internal state signals and identifications (IDs) of the plurality of nonvolatile memory chips, wherein in a first section of the external state signal having the set period, a duty cycle of the external state signal determines depending on the ID of the nonvolatile memory chip which outputs the internal state signal indicating a particular state among the plurality of nonvolatile memory chips.

It should be noted that objects of the present disclosure are not limited to the above-described objects, and other objects of the present disclosure will be apparent to those skilled in the art from the following descriptions.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
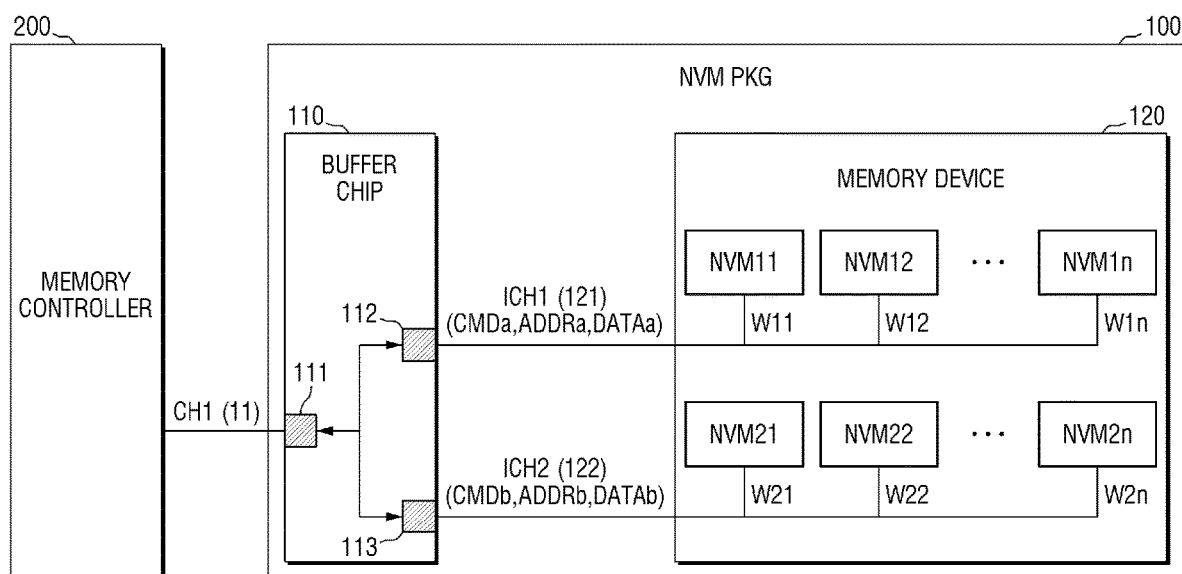
FIG. 1 is a block diagram illustrating a memory system according to some exemplary embodiments of the present disclosure.

FIG. 1 is a block diagram illustrating a memory system according to some exemplary embodiments of the present disclosure.

Referring to FIG. 1, a memory system 10 according to some exemplary embodiments may include a nonvolatile memory package 100 and a memory controller 200.

The nonvolatile memory package 100 may include a buffer chip 110 and a memory device 120.

The buffer chip 110 may be connected between the memory controller 200 and the memory device 120. The buffer chip 110 may include first through third pins 111, 112, and 113. A channel 11 may be formed between the first pin 111 and the memory controller 200. The buffer chip 110 may be connected to the memory controller 200 through the channel 11. A first internal channel 121 may be formed between the second pin 112 and the memory device 120. The buffer chip 110 may be connected to the memory device 120 through the first internal channel 121. A second internal channel 122 may be formed between the third pin 113 and the memory device 120. The buffer chip 110 may be connected to the memory device 120 through the second internal channel 122. The channel 11 may be connected to the first internal channel 121 and/or the second internal channel 122 through the buffer chip 110.

The buffer chip 110 may also be referred to as, for example, a "frequency boosting interface (FBI)."

The memory device 120 may include a plurality of nonvolatile memory chips NVM11 to NVM1*n* and NVM21 to NVM2*n* (n is a natural number greater than 1). Each of the plurality of nonvolatile memory chips NVM11 to NVM1*n* and NVM21 to NVM2*n* may be connected to one of the plurality of internal channels 121 and 122 through a corresponding way. For example, the nonvolatile memory chips NVM11 to NVM1*n* may be connected to the first internal channel 121 through ways W11 to W1*n*, and the nonvolatile memory chips NVM21 to NVM2*n* may be connected to the second internal channel 122 through ways W21 to W2*n*. In the exemplary embodiment, each of the nonvolatile memory chips NVM11 to NVM1*n* and NVM21 to NVM2*n* may be implemented as arbitrary memory units which may operate according to an individual command from the memory controller 200. For example, each of the nonvolatile memory chips NVM11 to NVM1*n* and NVM21 to NVM2*n* may be implemented as a chip or a die, but the present disclosure is not limited thereto.

The plurality of nonvolatile memory chips NVM11 to NVM1*n* and NVM21 to NVM2*n* may include flash memory devices. Alternatively, for example, the plurality of nonvolatile memory chips NVM11 to NVM1*n* and NVM21 to NVM2*n* may be NAND flash memories, vertical NAND (VNAND) flash memories, NOR flash memories, resistive random access memories (RRAMs), phase-change random access memories (PRAMs), magnetoresistive random access memories (MRAMs), ferroelectric random access memories, spin transfer torque random access memories (STT-RAMs), or the like. Also, the plurality of nonvolatile memory chips NVM11 to NVM1*n* and NVM21 to NVM2*n* according to some exemplary embodiments may include three-dimensional (3D) array structures.

The memory controller 200 may be connected to the memory device 120 through the channel 11 and the first internal channel 121 or the second internal channel 122. For example, through the channel 11 and the first internal channel 121, the memory controller 200 may transmit a command CMDa, an address ADDRa, and data DATAa to the memory device 120 or receive the data DATAa from the memory device 120. For example, through the channel 11 and the second internal channel 122, the memory controller 200 may transmit a command CMDb, an address ADDRb, and data DATAb to the memory device 120 or receive the data DATAb from the memory device 120.

The memory controller 200 may select one of nonvolatile memory devices connected to each channel through a corresponding channel and transmit and receive signals to and from the selected nonvolatile memory device. For example, the memory controller 200 may select the nonvolatile memory chip NVM11 among the nonvolatile memory chips NVM11 to NVM1*n* connected to the first internal channel 121. Through the channel 11 and the first internal channel 121, the memory controller 200 may transmit the command CMDa, the address ADDRa, and the data DATAa to the selected nonvolatile memory chip NVM11 or receive the data DATAa from the selected nonvolatile memory chip NVM11.

The memory controller 200 may transmit and receive signals to and from the memory device 120 in parallel through different channels. As an example, the memory controller 200 may transmit the command CMDb to the memory device 120 through the channel 11 and the second internal channel 122 while transmitting the command CMDa to the memory device 120 through the channel 11 and the first internal channel 121. As another example, the memory controller 200 may receive the data DATAb from the memory device 120 through the channel 11 and the second internal channel 122 while receiving the data DATAa from the memory device 120 through the channel 11 and the first internal channel 121.

The memory controller 200 may control the overall operation of the memory device 120. The memory controller 200 may control each of the nonvolatile memory chips NVM11 to NVM1*n* and NVM21 to NVM2*n* connected to the internal channels 121 and 122 by transmitting a signal to the channel 11. For example, the memory controller 200 may control a selected one of the nonvolatile memory chips NVM11 to NVM1n by transmitting the command CMDa and the address ADDRa through the channel 11 and the first internal channel 121.

Each of the nonvolatile memory chips NVM11 to NVM1n may operate according to control of the memory controller 200. As an example, the nonvolatile memory chip NVM11 may program the data DATAa according to the command CMDa, the address ADDRa, and the data DATAa provided to the first internal channel 121. As another example, the nonvolatile memory chip NVM21 may read the data DATAb according to the command CMDb and the address ADDRb provided to the second internal channel 122 and transmit the read data DATAb to the memory controller 200.

FIG. 1 shows that the two internal channels 121 and 122 are connected to the channel 11 and n nonvolatile memory chips are connected to each of the internal channels 121 and 122, but the number of internal channels connected to the channel 11 and the number of nonvolatile memory devices connected to each of the internal channels 121 and 122 may be varied.

Figure 2:
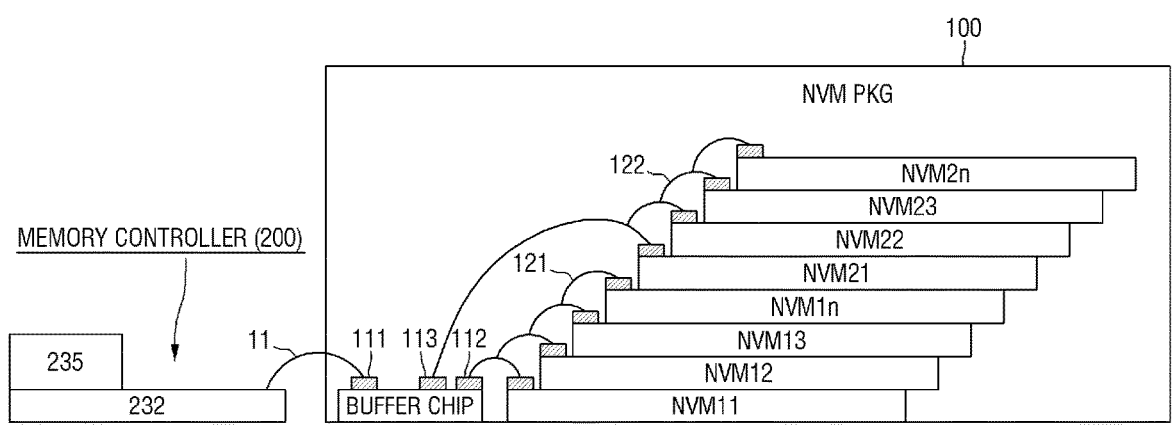
FIG. 2 is a diagram illustrating a nonvolatile memory package of FIG. 1 according to some exemplary embodiments of the present disclosure.

FIG. 2 is a diagram illustrating the nonvolatile memory package of FIG. 1 according to some exemplary embodiments of the present disclosure.

Referring to FIGS. 1 and 2, the nonvolatile memory package 100 may include the plurality of stacked nonvolatile memory chips NVM11 to NVM1n and NVM21 to NVM2n and the buffer chip 110.

FIG. 2 shows that the plurality of nonvolatile memory chips NVM11 to NVM1n and NVM21 to NVM2n are stacked in one direction, but the plurality of nonvolatile memory chips NVM11 to NVM1n and NVM21 to NVM2n may be stacked in various ways. For example, a part of the plurality of nonvolatile memory chips NVM11 to NVM1n and NVM21 to NVM2n may be stacked in a first direction, and another part of the plurality of nonvolatile memory chips NVM11 to NVM1n and NVM21 to NVM2n may be stacked in a second direction which differs from the first direction. Also, the plurality of nonvolatile memory chips NVM11 to NVM1n and NVM21 to NVM2n may be stacked to be spaced a certain distance from each other.

The buffer chip 110 may be disposed apart from the plurality of nonvolatile memory chips NVM11 to NVM1n and NVM21 to NVM2n. The buffer chip 110 may be disposed at the same level as the nonvolatile memory chip NVM11. However, the present disclosure is not limited thereto, and the buffer chip 110 may be stacked together with the plurality of nonvolatile memory chips NVM11 to NVM1n and NVM21 to NVM2n.

The buffer chip 110 may be connected to the nonvolatile memory chips NVM11 to NVM1n through the second pin 112 and the first internal channel 121 and may be connected to the nonvolatile memory chips NVM21 to NVM2n through the third pin 113 and the second internal channel 122.

The nonvolatile memory package 100 may be connected to a substrate 232 through the channel 11. Unlike shown in FIG. 2, the nonvolatile memory package 100 may be disposed on the substrate 232.

The memory controller 200 may be disposed on the substrate 232. Also, a nonvolatile interface circuit 202 for interfacing with the nonvolatile memory package 100 may be implemented on the substrate 232. The substrate 232 may be, for example, a printed circuit board (PCB).

The channel 11, the first internal channel 121, and the second internal channel 122 may be implemented by, for example, wire bonding.

Figure 3:
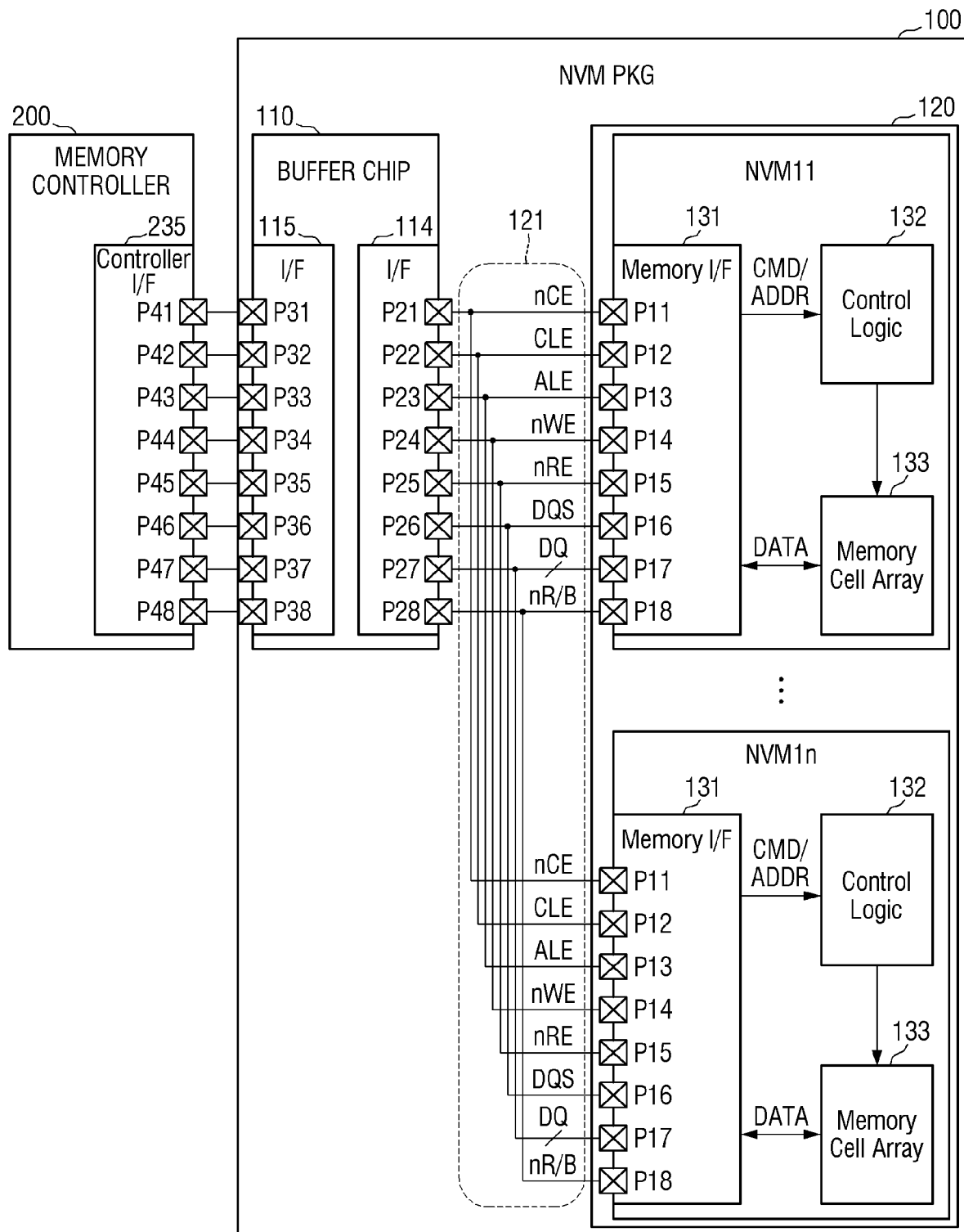
FIG. 3 is a block diagram illustrating the memory system of FIG. 1 according to example embodiments.

FIG. 3 is a block diagram illustrating the memory system of FIG. 1 according to example embodiments. FIG. 3 only shows the nonvolatile memory chips NVM11 to NVM1n, which communicate with the buffer chip 110 on the basis of the first internal channel 121, among the plurality of nonvolatile memory chips NVM11 to NVM1n and NVM21 to NVM2n of FIG. 1.

Referring to FIG. 3, each of the nonvolatile memory chips NVM11 to NVM1n may include first to eighth pins P11 to P18, a memory interface circuit 131, a control logic circuit 132, and a memory cell array 133.

The memory interface circuit 131 may receive a chip enable signal nCE from the memory controller 200 through the first pin P11. For example, the memory interface circuit 131 of a first nonvolatile memory chip NVM11 may receive a first chip enable signal nCE1 from the memory controller 200 through the first pin P11 of the first nonvolatile memory chip NVM11. For example, the memory interface circuit 131 of an nth nonvolatile memory chip NVM1n may receive an nth chip enable signal nCEn from the memory controller 200 through the first pin P11 of the nth nonvolatile memory chip NVM1n. The memory interface circuit 131 may transmit and receive signals to and from the memory controller 200 through the second to eighth pins P12 to P18 according to the first or nth chip enable signals nCE1 or nCEn. For example, when the first chip enable signal nCE1 is in an enable state (e.g., a low level), the memory interface circuit 131 of the first nonvolatile memory chip NVM11 may transmit and receive signals to and from the memory controller 200 through the second to eighth pins P12 to P18 of the first nonvolatile memory chip NVM11. For example, when the nth chip enable signal nCEn is in the enable state, the memory interface circuit 131 of the nth nonvolatile memory chip NVM1n may transmit and receive signals to and from the memory controller 200 through the second to eighth pins P12 to P18 of the nth nonvolatile memory chip NVM1n.

The memory interface circuit 131 may receive a command latch enable signal CLE, an address latch enable signal ALE, and a write enable signal nWE from the memory controller 200 through the second to fourth pins P12 to P14. Through the seventh pin P17, the memory interface circuit 131 may receive a data signal DQ from the memory controller 200 or transmit the data signal DQ to the memory controller 200. A command CMD, an address ADDR, and data DATA may be transmitted through the data signal DQ. For example, the data signal DQ may be transmitted through a plurality of data signal lines. In this case, the seventh pin P17 may include a plurality of pins corresponding to a plurality of data signals.

The memory interface circuit 131 may acquire the command CMD from the data signal DQ received in an enable section (e.g., a high-level state) of the command latch enable signal CLE on the basis of toggle timings of the write enable signal nWE. The memory interface circuit 131 may acquire the address ADDR from the data signal DQ received in an enable section (e.g., a high-level state) of the address latch enable signal ALE on the basis of the toggle timings of the write enable signal nWE.

In the exemplary embodiment, the write enable signal nWE may be toggled between a high level and a low level while being maintained in a static state (e.g., the high level or the low level). For example, the write enable signal nWE may be toggled in a section in which the command CMD or the address ADDR is transmitted. Accordingly, the memory interface circuit 131 may acquire the command CMD or the address ADDR on the basis of the toggle timings of the write enable signal nWE.

The memory interface circuit 131 may receive a read enable signal nRE from the memory controller 200 through the fifth pin P15. Through the sixth pin P16, the memory interface circuit 131 may receive a data strobe signal DQS from the memory controller 200 or transmit the data strobe signal DQS to the memory controller 200.

During an operation in which the memory device 120 outputs the data DATA, the memory interface circuit 131 may receive a toggling read enable signal nRE through the fifth pin P15 before outputting the data DATA. The memory interface circuit 131 may generate a toggling data strobe signal DQS on the basis of the toggling of the read enable signal nRE. For example, the memory interface circuit 131 may generate the data strobe signal DQS which starts to toggle after a predetermined delay (e.g., tDQSRE) based on a toggling start time of the read enable signal nRE. The memory interface circuit 131 may transmit the data signal DQ including the data DATA on the basis of toggle timings of the data strobe signal DQS. Accordingly, the data DATA may be transmitted to the memory controller 200 according to the toggle timings of the data strobe signal DQS.

During an operation in which the memory device 120 inputs the data DATA, when the data signal DQ including the data DATA is received from the memory controller 200, the memory interface circuit 131 may receive a toggling data strobe signal DQS together with the data DATA from the memory controller 200. The memory interface circuit 131 may acquire the data DATA from the data signal DQ on the basis of the toggle timings of the data strobe signal DQS. For example, the memory interface circuit 131 may acquire the data DATA by sampling the data signal DQ at rising edges and/or falling edges of the data strobe signal DQS.

The memory interface circuit 131 may transmit a ready/busy output signal nR/B to the memory controller 200 through the eighth pin P18. For example, the memory interface circuit 131 of the first nonvolatile memory chip NVM11 may transmit a first ready/busy output signal nR/B1 to the memory controller 200 through the eighth pin P18 of the first nonvolatile memory chip NVM11. For example, the memory interface circuit 131 of the nth nonvolatile memory chip NVM1n may transmit an nth ready/busy output signal nR/Bn to the memory controller 200 through the eighth pin P18 of the nth nonvolatile memory chip NVM1n. Here, the eighth pin P18 may be referred to as a status output pin. The memory interface circuit 131 may transmit state information of the memory device 120 to the memory controller 200 through the ready/busy output signal nR/B. When the memory device 120 is in a busy state (i.e., when internal operations of the memory device 120 are being performed), the memory interface circuit 131 may transmit the ready/busy output signal nR/B indicating the busy state to the memory controller 200. When the memory device 120 is in a ready state (i.e., when internal operations of the memory device 120 are not being performed or have been completed), the memory interface circuit 131 may transmit the ready/busy output signal nR/B indicating the ready state to the memory controller 200. As an example, while the memory device 120 is reading the data DATA from the memory cell array 133 in response to a page read command, the memory interface circuit 131 may transmit the ready/busy output signal nR/B indicating the busy state (e.g., a low level) to the memory controller 200. As another example, while the memory device 120 is programming the data DATA to the memory cell array 133 in response to a program command, the memory interface circuit 131 may transmit the ready/busy output signal nR/B indicating the busy state to the memory controller 200.

The control logic circuit 132 may control the various operations of the memory device 120. The control logic circuit 132 may receive the acquired command CMD or address ADDR from the memory interface circuit 131. The control logic circuit 132 may generate control signals for controlling other elements of the memory device 120 according to the received command CMD or address ADDR. For example, the control logic circuit 132 may generate various control signals for programming the data DATA to the memory cell array 133 or reading the data DATA from the memory cell array 133.

The memory cell array 133 may store the data DATA acquired from the memory interface circuit 131 according to control of the control logic circuit 132. The memory cell array 133 may output the stored data DATA to the memory interface circuit 131 according to control of the control logic circuit 132.

The memory cell array 133 may include a plurality of memory cells. For example, the plurality of memory cells may be flash memory cells. However, the present disclosure is not limited thereto, and the memory cells may be RRAM cells, ferroelectric random access memory (FRAM) cells, PRAM cells, thyristor random access memory (TRAM) cells, or magnetic random access memory (MRAM) cells. Exemplary embodiments of the present disclosure will be described below, focusing on an embodiment in which memory cells are NAND flash memory cells.

The buffer chip 110 may include first to eighth pins P21 to P28, first to eighth pins P31 to P38, a first interface circuit 114, and a second interface circuit 115.

The first to eighth pins P21 to P28 of the buffer chip 110 may correspond to the first to eight pins P11 to P18 of the memory device 120. The first to eighth pins P21 to P28 of the buffer chip 110 may be connected in common to the first to eighth pins P11 to P18 of the nonvolatile memory chips NVM11 to NVM1n. In example embodiments, some of the first to eighth pins P21 to P28 of the buffer chip 110 may be separately connected to the first to eighth pins P11 to P18 of the nonvolatile memory chips NVM11 to NVM1n. In example embodiments, some of the first to eighth pins P21 to P28 of the buffer chip 110 may include a plurality of pins. In some examples, the first pin P21 of the buffer chip 110 may include n pins corresponding to the first through nth chip enable signals nCE1 through nCEn. In some examples, the eighth pin P28 of the buffer chip 110 may include n pins corresponding to the first through nth ready/busy output signals nR/B1 through nR/Bn.

The first to eighth pins P31 to P38 of the buffer chip 110 may correspond to the first to eighth pins P21 to P28 of the buffer chip 110. In example embodiments, some of the first to eighth pins P31 to P38 of the buffer chip 110 may include a plurality of pins. In some examples, the first pin P31 of the buffer chip 110 may include n pins corresponding to the first through nth pins P21.

For example, each of the first to eighth pins P21 to P28 of the buffer chip 110 may be implemented as the second pin 112 of FIGS. 1 and 2, and each of the first to eighth pins P31 to P38 of the buffer chip 110 may be implemented as the first pin 111 of FIGS. 1 and 2.

The memory controller 200 may include first to eighth pins P41 to P48 and a controller interface circuit 235. The first to eighth pins P41 to P48 of the memory controller 200 may correspond to the first to eighth pins P31 to P38 of the buffer chip 110. Accordingly, the first to eighth pins P41 to P48 of the memory controller 200 may correspond to the first to eighth pins P11 to P18 of the memory device 120.

The controller interface circuit 235 may transmit the chip enable signal nCE to the memory device 120 through the first pin P41. The controller interface circuit 235 may transmit and receive signals to and from the memory device 120 selected by the chip enable signal nCE through the second to eighth pins P22 to P28. In some examples, the first pin P41 of the memory controller 200 may include n pins corresponding to the first through nth pins P31.

The controller interface circuit 235 may transmit the command latch enable signal CLE, the address latch enable signal ALE, and the write enable signal nWE to the memory device 120 through the second to fourth pins P42 to P44. Through the seventh pin P47, the controller interface circuit 235 may transmit the data signal DQ to the memory device 120 or receive the data signal DQ from the memory device 120.

The controller interface circuit 235 may transmit the data signal DQ including the command CMD or the address ADDR to the memory device 120 together with the toggling write enable signal nWE. When transmitting the command latch enable signal CLE having the enable state, the controller interface circuit 235 may transmit the data signal DQ including the command CMD to the memory device 120. When transmitting the address latch enable signal ALE having the enable state, the controller interface circuit 235 may transmit the data signal DQ including the address ADDR to the memory device 120.

The controller interface circuit 235 may transmit the read enable signal nRE to the memory device 120 through the fifth pin P45. Through the sixth pin P46, the controller interface circuit 235 may receive the data strobe signal DQS from the memory device 120 or transmit the data strobe signal DQS to the memory device 120.

During an operation in which the memory device 120 outputs the data DATA, the controller interface circuit 235 may generate a toggling read enable signal nRE and transmit the read enable signal to the memory device 120. For example, before the data DATA is output, the controller interface circuit 235 may generate the read enable signal nRE which is switched from a static state (e.g., a high level or low level) to a toggling state. Accordingly, a data strobe signal DQS which toggles on the basis of the read enable signal nRE may be generated by the memory device 120. The controller interface circuit 235 may receive the data signal DQ including the data DATA from the memory device 120 together with the toggling data strobe signal DQS. The controller interface circuit 235 may acquire the data DATA from the data signal DQ on the basis of toggle timings of the data strobe signal DQS.

During an operation in which the memory device 120 inputs the data DATA, the controller interface circuit 235 may generate a toggling data strobe signal DQS. For example, before transmitting the data DATA, the controller interface circuit 235 may generate the data strobe signal DQS which is switched from a static state (e.g., a high level or low level) to a toggling state. The controller interface circuit 235 may transmit the data signal DQ including the data DATA to the memory device 120 on the basis of the toggle timings of the data strobe signal DQS.

Figure 4:
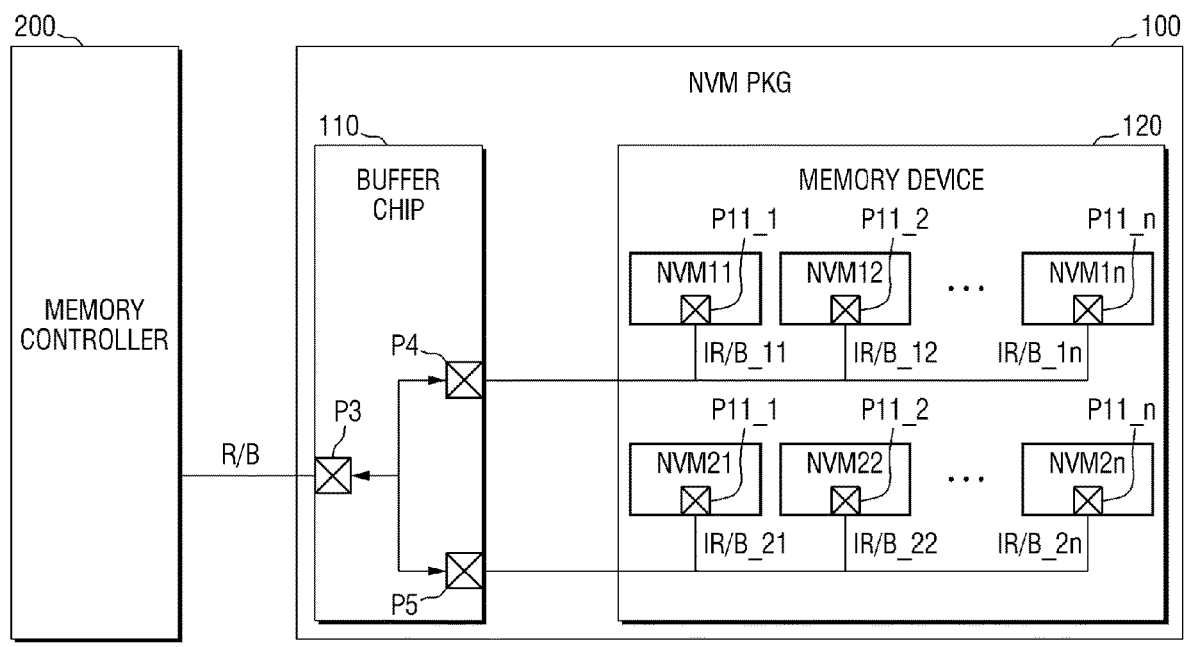
FIG. 4 is a block diagram illustrating the operation of the memory system according to some exemplary embodiments of the present disclosure.

The controller interface circuit 235 may receive the ready/busy output signal nR/B from the memory device 120 through the eighth pin P48. The controller interface circuit 235 may determine state information of the memory device 120 on the basis of the ready/busy output signal nR/B. In example embodiments, a first nonvolatile memory chip NVM11 of the memory device 120 may transmit a first ready/busy output signal nR/B1 from FIG. 4 is a block diagram illustrating the operation of the memory system according to some exemplary embodiments of the present disclosure. FIG. 4 shows only a ready/busy output signal among the plurality of signals of FIG. 3.

Referring to FIG. 4, the plurality of nonvolatile memory chips NVM11 to NVM1n and NVM21 to NVM2n may respectively include first pins P11_1 to P11_n. The nonvolatile memory chips NVM11 to NVM1n may respectively provide internal state signals IR/B_11 to IR/B_1n to a pin P4 of the buffer chip 110. The nonvolatile memory chips NVM21 to NVM2n may respectively provide internal state signals IR/B_21 to IR/B_2n to a pin P5 of the buffer chip 110. In example embodiments, each of the pins P4 and P5 may include n pins corresponding to the internal state signals IR/B_11 to IR/B_1n and IR/B_21 to IR/B_2n, respectively.

The buffer chip 110 may receive the plurality of internal state signals IR/B_11 to IR/B_1n and IR/B_21 to IR/B_2n from the memory device 120. The buffer chip 110 may output an external state signal R/B through a pin P3 on the basis of the plurality of internal state signals IR/B_11 to IR/B_1n and IR/B_21 to IR/B_2n. The external state signal R/B may be, for example, one signal.

The buffer chip 110 may output the external state signal RIB, for example, every set period. As another example, when the buffer chip 110 receives a command, the buffer chip 110 may output the external state signal R/B in response to the command. The command may be an input/output command such as a read command or a write command.

The memory controller 200 may receive the external state signal R/B from the buffer chip 110 and determine states of the plurality of nonvolatile memory chips NVM11 to NVM1n and NVM21 to NVM2n on the basis of the external state signal R/B. For example, the memory controller 200 may determine the states of the plurality of nonvolatile memory chips NVM11 to NVM1n and NVM21 to NVM2n according to a duty cycle of the external state signal R/B. For example, the memory controller 200 may determine the states of the plurality of nonvolatile memory chips NVM11 to NVM1n and NVM21 to NVM2n on the basis of, for example, the length of a section which is included in every setting period of the external state signal RIB and has a first logic level. Here, the first logic level may be a low level.

States may include, for example, first to third states. The first to third states may respectively be, for example, a ready state, a busy state, and a preset state. The preset state is, for example, a state preset between the memory controller 200 and the buffer chip 110 and may be set before shipment of the memory system 10. The preset state may be, for example, a write error, a read error, or the like of a nonvolatile memory chip. Hereinafter, the operation of the memory system 10 will be described in detail with reference to FIGS. 5 to 7.

Figure 5:
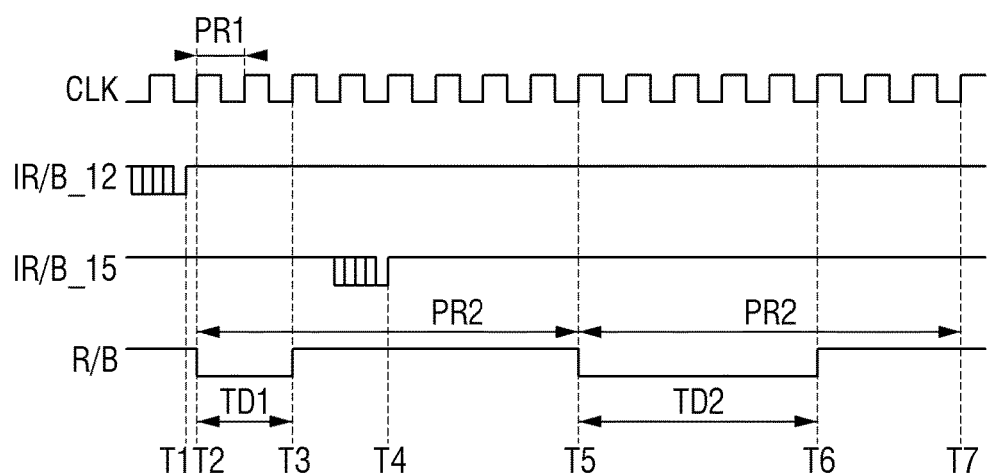
FIGS. 5 to 7 are timing diagrams illustrating operations of the memory system of FIG. 4 according to some exemplary embodiments of the present disclosure.
Figure 6:
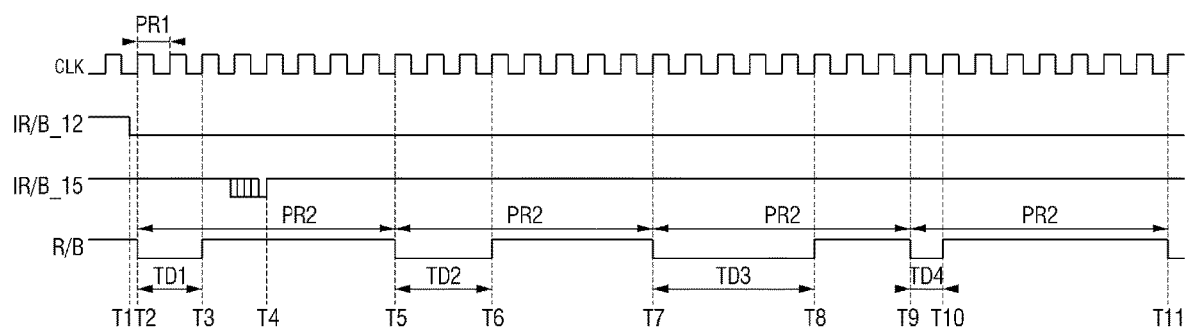
Figure 7:
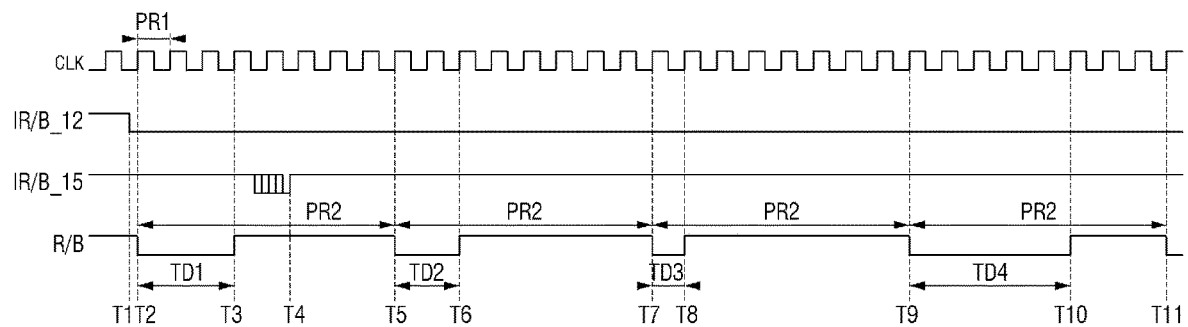

FIGS. 5 to 7 are timing diagrams illustrating operations of the memory system of FIG. 4 according to some exemplary embodiments of the present disclosure.

Referring to FIGS. 4 and 5, the buffer chip 110 may output the external state signal RIB on the basis of an internal state signal indicating a particular state (e.g., a first state) among the plurality of internal state signals IR/B_11 to IR/B_1n and IR/B_21 to IR/B_2n every set period PR2. For example, the buffer chip 110 may output the external state signal RIB, which indicates that any one of the nonvolatile memory chips NVM11 to NVM1n and NVM21 to NVM2n is in the first state, every set period PR2. The buffer chip 110 may determine a duty cycle in the set period PR2 on the basis of identifications (IDs) of the nonvolatile memory chips NVM11 to NVM1n and NVM21 to NVM2n which output the internal state signal IR/B_11 to IR/B_1n and IR/B_21 to IR/B_2n indicating the first state. For example, in the set period PR2, the duty cycle of the external state signal R/B may be proportional to the IDs of the nonvolatile memory chips NVM11 to NVM1n and NVM21 to NVM2n.

For example, the length of a section having the first logic level in the set period PR2 may be the products of the IDs of the nonvolatile memory chips NVM11 to NVM1n and NVM21 to NVM2n and a clock cycle (or, a clock period) PR1, and the set period PR2 may be greater than the product of the number of the nonvolatile memory chips NVM11 to NVM1n and NVM21 to NVM2n and the clock cycle PR1.

Here, the first state may be a ready state. Also, the IDs of the nonvolatile memory chips NVM11 to NVM1n and NVM21 to NVM2n and the first state being the ready state may be set in advance in the memory controller 200 and the buffer chip 110.

Specifically, referring to FIG. 5, the nonvolatile memory chip NVM12 of the memory device 120 may output the internal state signal IR/B_12 having a second logic level at a time point T1. The nonvolatile memory chip NVM15 of the memory device 120 may output the internal state signal IR/B_15 having the second logic level at a time point T4 which is later than the time point T1. Here, the first logic level is the low level which may indicate the busy state, and the second logic level is the high level which may indicate the ready state. For example, the nonvolatile memory chip NVM12 may be in the ready state at the time point T1, and the nonvolatile memory chip NVM15 may be in the ready state at the time point T4. Here, the ID of the nonvolatile memory chip NVM12 may be 2, and the ID of the nonvolatile memory chip NVM15 may be 5.

Since the ID of the nonvolatile memory chip NVM12 is 2, the length of a section TD1, which is included in a first section T2 to T5 and has the first logic level, may be double the clock cycle PR1. Since the ID of the nonvolatile memory chip NVM15 is 5, the length of a section TD2, which is included in a second section T5 to T7 and has the first logic level, may be five times the clock cycle PR1. For example, the duty cycle of the external state signal R/B in the second section T5 to T7 may be 2.5 times the duty cycle of the external state signal R/B in the first section T2 to T5.

Consequently, the length of the section TD1 having the first logic level in the first section T2 to T5 is double the clock cycle PR1, and thus the memory controller 200 may determine that the nonvolatile memory chip NVM12 having an ID of 2 is in the ready state. Also, the length of the section TD2 having the first logic level in the second section T5 to T7 is five times the clock cycle PR1, and thus the memory controller 200 may determine that the nonvolatile memory chip NVM15 having an ID of 5 is in the ready state.

FIG. 5 has been described on the assumption that the first state is the ready state. However, the present disclosure is not limited thereto, and the first state may be the busy state or the preset state. Also, the buffer chip 110 may determine the length of a second section having the second logic level in the set period PR2 on the basis of the IDs of the nonvolatile memory chips NVM11 to NVM1n and NVM21 to NVM2n which output the internal state signals IR/B_11 to IR/B_1n and IR/B_21 to IR/B_2n indicating the first state. For example, the length of the second section having the second logic level may be proportional to the IDs of the nonvolatile memory chips NVM11 to NVM1n and NVM21 to NVM2n which output the internal state signals IR/B_11 to IR/B_1n and IR/B_21 to IR/B_2n indicating the first state.

When the buffer chip 110 multiplexes the plurality of internal state signals IR/B_11 to IR/B_1n and IR/B_21 to IR/B_2n and outputs the external state signal R/B, the memory controller 200 may not determine which of the nonvolatile memory chips NVM11 to NVM1n and NVM21 to NVM2n is in the ready state and which of the nonvolatile memory chips NVM11 to NVM1n and NVM21 to NVM2n is in the busy state. Accordingly, the memory controller 200 provides a status read command to the plurality of nonvolatile memory chips NVM11 to NVM1n and NVM21 to NVM2n to read the states of the plurality of nonvolatile memory chips NVM11 to NVM1n and NVM21 to NVM2n.

In the memory system 10 according to some exemplary embodiments, the buffer chip 110 may transmit the IDs of the nonvolatile memory chips NVM11 to NVM1n and NVM21 to NVM2n which are in the ready state through the external state signal RIB using the length or a duty cycle of a section having the first logic level. Accordingly, the memory controller 200 can determine which of the nonvolatile memory chips NVM11 to NVM1n and NVM21 to NVM2n is in the ready state or busy state without a status read command. Consequently, command overhead is not caused by a status read command in the memory system 10 according to some exemplary embodiments.

Referring to FIGS. 4 and 6, the external state signal RIB may sequentially and consecutively include the first section T2 to T5, the second section T5 to T7, a third section T7 to T9, and a fourth section T9 to T11. The first state in FIG. 5 may be one of second to fourth states in FIG. 6.

The buffer chip 110 may determine the length of a section having the first logic level in the first section T2 to T5 on the basis of the IDs of the nonvolatile memory chips NVM11 to NVM1n and NVM21 to NVM2n which output the internal state signals IR/B_11 to IR/B_1n and IR/B_21 to IR/B_2n and may determine the length of a section having the first logic level in the second section T5 to T7 on the basis of which one of the second to fourth states the internal state signals IR/B_11 to IR/B_1n and IR/B_21 to IR/B_2n are in.

For example, the second state may be the ready state, the third state may be the busy state, and the fourth state may be a state in which a preset event has occurred, that is, a state in which an error has occurred in the nonvolatile memory chips NVM11 to NVM1n and NVM21 to NVM2n. As an example, in the ready state, the length of a section having the first logic level may be equal to the clock cycle PR1. In the busy state, the length of a section having the first logic level may be two times the clock cycle PR1. In the state in which an error has occurred, the length of a section having the first logic level may be three times the clock cycle PR1. The second to fourth states and how many times the clock cycle is the length of a section having the first logic level in the second to fourth states may be determined in advance in the memory controller 200 and the buffer chip 110.

Specifically, referring to FIG. 6, the nonvolatile memory chip NVM12 of the memory device 120 may output the internal state signal IR/B_12 having the first logic level at the time point T1. The nonvolatile memory chip NVM15 of the memory device 120 may output the internal state signal IR/B_15 having the second logic level at the time point T4 which is later than the time point T1. For example, at the time point T1, the nonvolatile memory chip NVM12 may be in the state in which an error has occurred, and the nonvolatile memory chip NVM15 may be in the ready state at the time point T4. In some examples, the nonvolatile memory chip NVM12 may be the busy state in which the nonvolatile memory chip NVM12 may operate. Here, the ID of the nonvolatile memory chip NVM12 may be 2, and the ID of the nonvolatile memory chip NVM15 may be 5.

Since the ID of the nonvolatile memory chip NVM12 is 2, the length of the section TD1, which is included in the first section T2 to T5 and has the first logic level, may be double the clock cycle PR1. Since the nonvolatile memory chip NVM12 is in the state in which an error has occurred, the length of the section TD2, which is included in the second section T5 to T7 and has the first logic level, may be three times the clock cycle PR1. For example, the duty cycle of the external state signal RIB in the second section T5 to T7 may be 1.5 times the duty cycle of the external state signal R/B in the first section T2 to T5.

Subsequently, since the ID of the nonvolatile memory chip NVM15 is 5, the length of a section TD3, which is included in the third section T7 to T9 and has the first logic level, may be five times the clock cycle PR1. Since the nonvolatile memory chip NVM15 is in the ready state, the length of a section TD4, which is included in the fourth section T9 to T11 and has the first logic level, may be equal to the clock cycle PR1. For example, the duty cycle of the external state signal RIB in the fourth section T9 to T11 may be 0.2 times the duty cycle of the external state signal RIB in the third section T7 to T9.

Since the length of the section TD1 having the first logic level in the first section T2 to T5 is double the clock cycle PR1 and the length of the section TD2 having the first logic level in the following second section T5 to T7 is three times the clock cycle PR1, the memory controller 200 may determine that the nonvolatile memory chip NVM12 having the ID of 2 is in the state in which an error has occurred. Also, since the length of the section TD3 having the first logic level in the third section T7 to T9 is five times the clock cycle PR1 and the length of the section TD4 having the first logic level in the following fourth section T9 to T11 is equal to the clock cycle PR1, the memory controller 200 may determine that the nonvolatile memory chip NVM15 having the ID of 5 is in the ready state.

In the memory system 10 according to some embodiments, the memory controller 200 may determine a state on the basis of the external state signal RIB of even-numbered periods and may detect the IDs of the nonvolatile memory chips NVM11 to NVM1$n$ and NVM21 to NVM2$n$ on the basis of the external state signal R/B of odd-numbered periods.

In the drawings, it has been described that an internal state signal is switched from the second logic level to the first logic level when an error occurs, but the present disclosure is not limited thereto. When an error occurs, an internal state signal may be switched from the first logic level to the second logic level.

Referring to FIGS. 4 and 7, the buffer chip 110 may determine the length of a section having the first logic level in the first section T2 to T5 on the basis of which one of the second to fourth states the internal state signals IR/B_11 to IR/B_1$n$ and IR/B_21 to IR/B_2$n$ are in and may determine the length of a section having the first logic level in the second section T5 to T7 on the basis of the IDs of the nonvolatile memory chips NVM11 to NVM1$n$ and NVM21 to NVM2$n$ which output the internal state signals IR/B_11 to IR/B_1$n$ and IR/B_21 to IR/B_2$n$.

Referring to FIG. 7, at the time point T1, the nonvolatile memory chip NVM12 may be in the state in which an error has occurred, and the nonvolatile memory chip NVM15 may be in the ready state at the time point T4. Here, the ID of the nonvolatile memory chip NVM12 may be 2, and the ID of the nonvolatile memory chip NVM15 may be 5.

Since the nonvolatile memory chip NVM12 is in the state in which an error has occurred, the length of the section TD1, which is included in the first section T2 to T5 and has the first logic level, may be three times the clock cycle PR1. Since the ID of the nonvolatile memory chip NVM12 is 2, the length of the section TD2, which is included in the second section T5 to T7 and has the first logic level, may be double the clock cycle PR1. For example, the duty cycle of the external state signal R/B in the first section T2 to T5 may be 1.5 times the duty cycle of the external state signal RIB in the second section T5 to T7.

Subsequently, since the nonvolatile memory chip NVM15 is in the ready state, the length of the section TD3, which is included in the third section T7 to T9 and has the first logic level, may be equal to the clock cycle PR1. Since the ID of the nonvolatile memory chip NVM15 is 5, the length of the section TD4, which is included in the fourth section T9 to T11 and has the first logic level, may be five times the clock cycle PR1. For example, the duty cycle of the external state signal RIB in the fourth section T9 to T11 may be five times the duty cycle of the external state signal RIB in the third section T7 to T9.

Accordingly, the memory controller 200 may determine, on the basis of the external state signal R/B, that the nonvolatile memory chip NVM12 is in the state in which an error has occurred and the nonvolatile memory chip NVM15 is in the ready state. For example, the memory controller 200 may determine a state on the basis of the external state signal RIB of odd-numbered periods and may detect the IDs of the nonvolatile memory chips NVM11 to NVM1$n$ and NVM21 to NVM2$n$ on the basis of the external state signal RIB of even-numbered periods.

Figure 8:
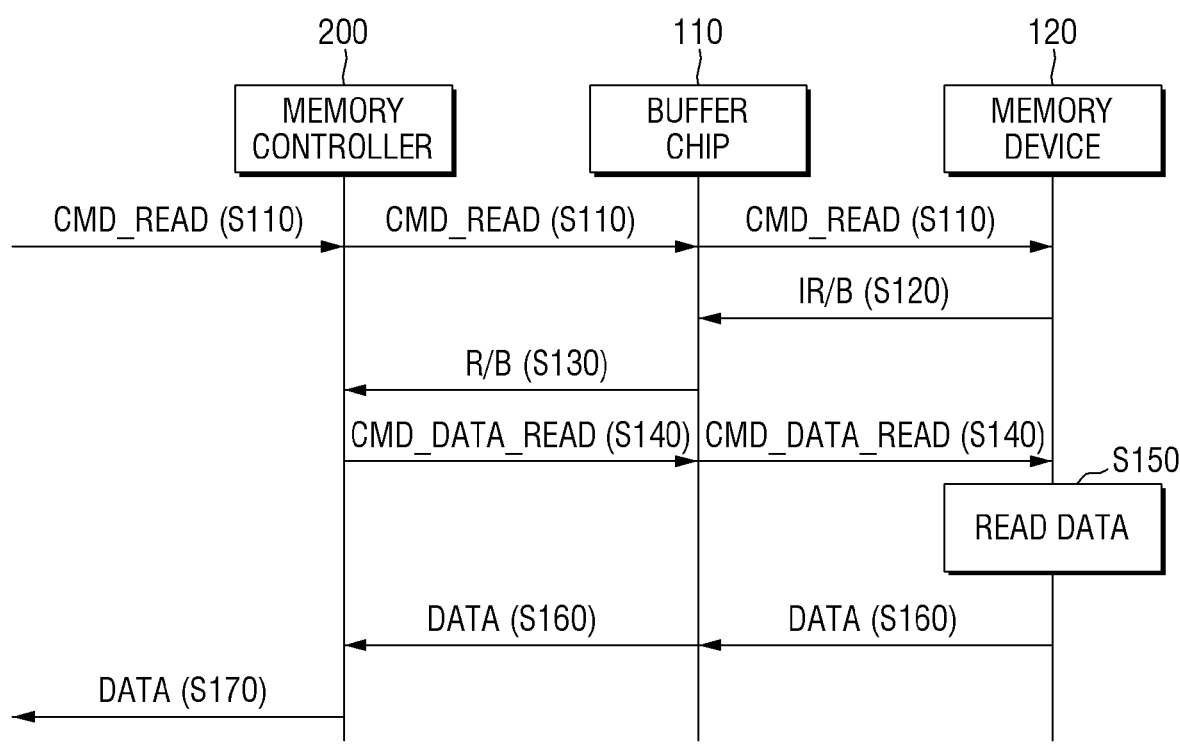
FIG. 8 is a sequence diagram illustrating an operation of the memory system according to some exemplary embodiments of the present disclosure.

FIG. 8 is a sequence diagram illustrating an operation of the memory system according to some exemplary embodiments of the present disclosure.

Referring to FIG. 8, the memory controller 200 may externally receive a read command CMD_READ (S110). The buffer chip 110 may receive the read command CMD_READ (S110) from the memory controller 200 and provide the read command CMD_READ (S110) to the memory device 120. For example, the read command CMD_READ may include information of an address ADDR of the nonvolatile memory chips NVM11 to NVM1$n$ and NVM21 to NVM2$n$.

In response to the read command CMD_READ, each of the plurality of nonvolatile memory chips included in the memory device 120 may provide an internal state signal IR/B to the buffer chip 110 (S120).

The buffer chip 110 may output the external state signal RIB on the basis of the internal state signal IR/B (S130). The buffer chip 110 may output the external state signal RIB as described above with reference to FIGS. 1 to 7. For example, when the internal state signal IR/B is maintained at the second logic level at a start time point of the set period PR2, the buffer chip 110 may determine the time point as an end time point of the internal state signal I/B and output the external state signal R/B.

The memory controller 200 may determine states of the plurality of nonvolatile memory chips included in the memory device 120 on the basis of the external state signal RIB and provide the externally received read command CMD_READ to the memory device 120 through the buffer chip 110 on the basis of the determined states of the plurality of memory chips (S140). For example, the read command CMD_READ (S140) may be a data read command CMD_DATA_READ (S140) to read data from a nonvolatile memory chip of the memory device 120 which is in a ready state. For example, the data read command CMD_DATA_READ (S140) may not include information of the address ADDR. The memory controller 200 may determine which of the nonvolatile memory chips is in the ready state as described above with reference to FIGS. 1 to 7. The memory controller 200 may provide the data read command CMD_DATA_READ to the nonvolatile memory chip, which is in the ready state, through the buffer chip 110.

The nonvolatile memory chip which receives the data read command CMD_DATA_READ in the memory device 120 may read data in response to the data read command CMD_DATA_READ (S150).

The nonvolatile memory chip which receives the data read command CMD_DATA_READ in the memory device 120 may provide the read data to the memory controller 200 through the buffer chip 110 (S160).

The memory controller 200 may externally provide the data read in response to the externally received read command CMD_READ (S170).

In the memory system 10 according to some exemplary embodiments, the memory controller 200 may determine states of the nonvolatile memory chips included in the memory device 120 without a status read command. Consequently, the memory system 10 can respond to an externally received command more rapidly.

Figure 9:
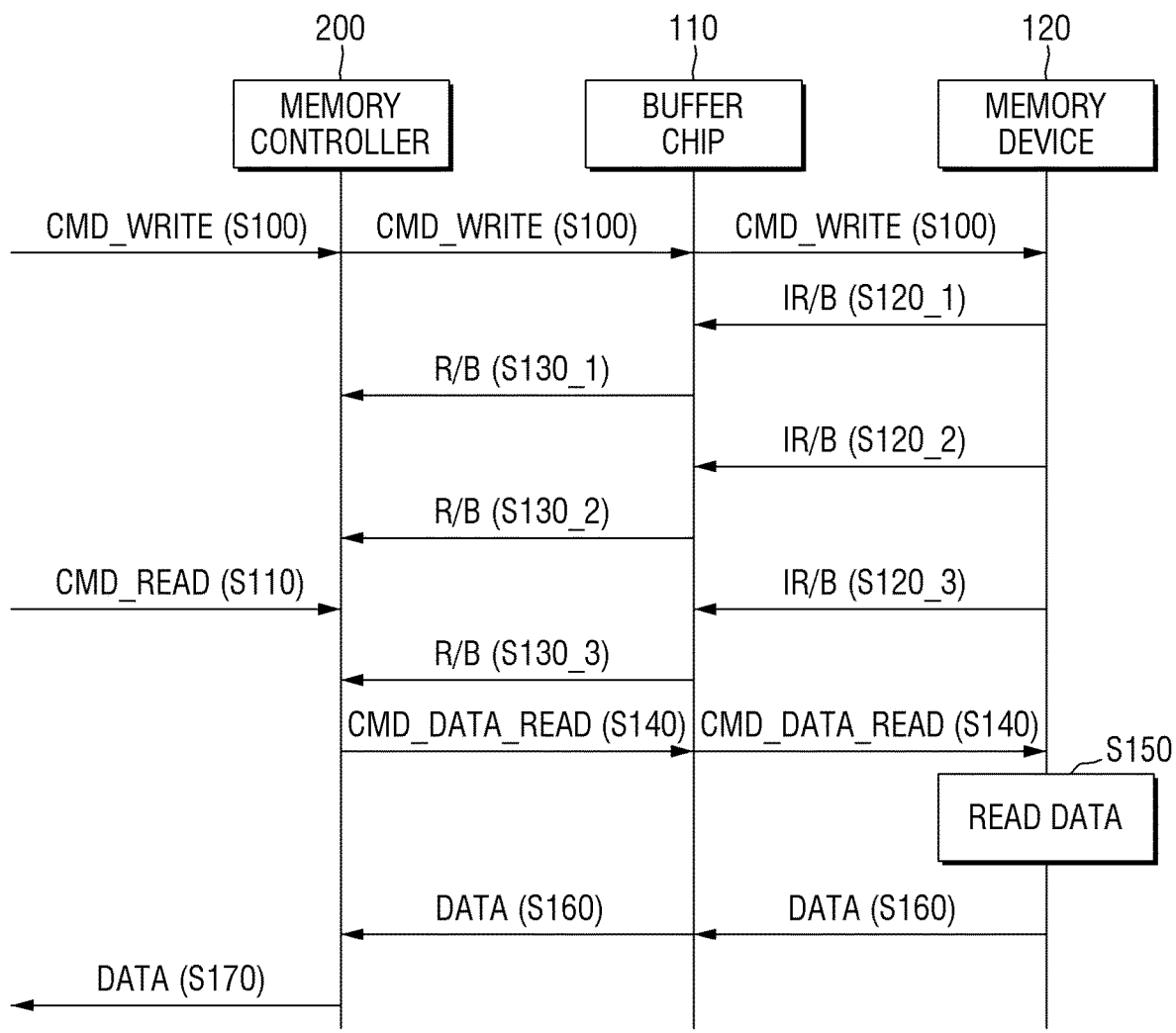
FIG. 9 is a sequence diagram illustrating an operation of the memory system according to some exemplary embodiments of the present disclosure.

FIG. 9 is a sequence diagram illustrating an operation of the memory system according to some exemplary embodiments of the present disclosure. Differences from FIG. 8 will be mainly described.

Referring to FIG. 9, the memory controller 200 may externally receive a write command CMD_WRITE (S100). The buffer chip 110 may receive the write command CMD_WRITE (S100) from the memory controller 200 and provide the write command CMD_WRITE (S100) to the memory device 120. For example, the write command CMD_WRITE (S100) may include information of an address ADDR of the nonvolatile memory chips NVM11 to NVM1n and NVM21 to NVM2n. According to some exemplary embodiments, the plurality of nonvolatile memory chips included in the memory device 120 may periodically provide the internal state signal IR/B to the buffer chip 110 (S120_1, S120_2, and S120_3). For example, the plurality of nonvolatile memory chips may provide the internal state signal IR/B to the buffer chip 110 when the memory device 120 receives the write command CMD_WRITE. The periods may be preset periods.

The buffer chip 110 may periodically output the external state signal RIB on the basis of the internal state signal IR/B (S130_1, S130_2, and S130_3). The periods may be preset periods. Also, the periods may be identical to or different from the periods at which the internal state signal IR/B is provided from the memory device 120 to the buffer chip 110.

The memory controller 200 may externally receive the read command CMD_READ (S110). For example, the memory controller 200 may receive the read command CMD_READ after a write operation of the memory device 120 responsive to the write command CMD_WRITE is completed.

The memory controller 200 may determine states of the plurality of nonvolatile memory chips included in the memory device 120 on the basis of the external state signal RIB received from the buffer chip 110 after the read command CMD_READ is received and provide the externally received read command CMD_READ to the memory device 120 through the buffer chip 110 on the basis of the determined states of the plurality of memory chips (S140). For example, the read command CMD_READ (S140) may be a data read command CMD_DATA_READ (S140) to read data from a nonvolatile memory chip of the memory device 120 which is in a ready state.

Subsequently, as described above with reference to FIG. 8, a nonvolatile memory chip which receives the data read command CMD_DATA_READ in the memory device 120 may read data in response to the data read command CMD_DATA_READ (S150), and the read data may be provided to the memory controller 200 through the buffer chip 110 (S160).

The memory controller 200 may externally provide the data read in response to the externally received read command CMD_READ (S170).

Figure 10:
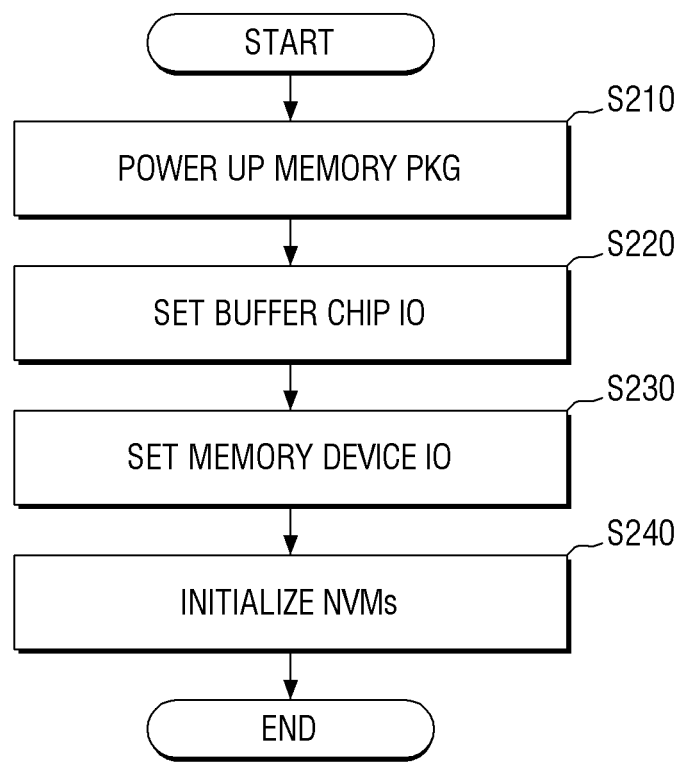
FIG. 10 is a flowchart illustrating an operation of a nonvolatile memory package according to some exemplary embodiments of the present disclosure.

FIG. 10 is a flowchart illustrating an operation of a nonvolatile memory package according to some exemplary embodiments of the present disclosure.

Referring to FIGS. 1 and 10, power may be supplied to the nonvolatile memory package 100 according to some exemplary embodiments (S210). Accordingly, the nonvolatile memory package 100 may be booted. Alternatively, the nonvolatile memory package 100 may be reset.

Subsequently, an input/output line of the buffer chip 110 may be set (S220). The channel 11, the first internal channel 121, and the second internal channel 122 connected to the buffer chip 110 may be set.

Subsequently, an input/output line of the memory device 120 may be set (S230). Input/output lines of the plurality of nonvolatile memory chips NVM11 to NVM1n and NVM21 to NVM2n included in the memory device 120 may be set. The ways W11 to W1n of the nonvolatile memory chips NVM11 to NVM1n connected to the first internal channel 121 may be set. The ways W21 to W2n of the nonvolatile memory chips NVM21 to NVM2n connected to the second internal channel 122 may be set.

Subsequently, the plurality of nonvolatile memory chips NVM11 to NVM1n and NVM21 to NVM2n may be initialized (S240). Accordingly, the IDs of the plurality of nonvolatile memory chips NVM11 to NVM1n and NVM21 to NVM2n may be set.

Figure 11:
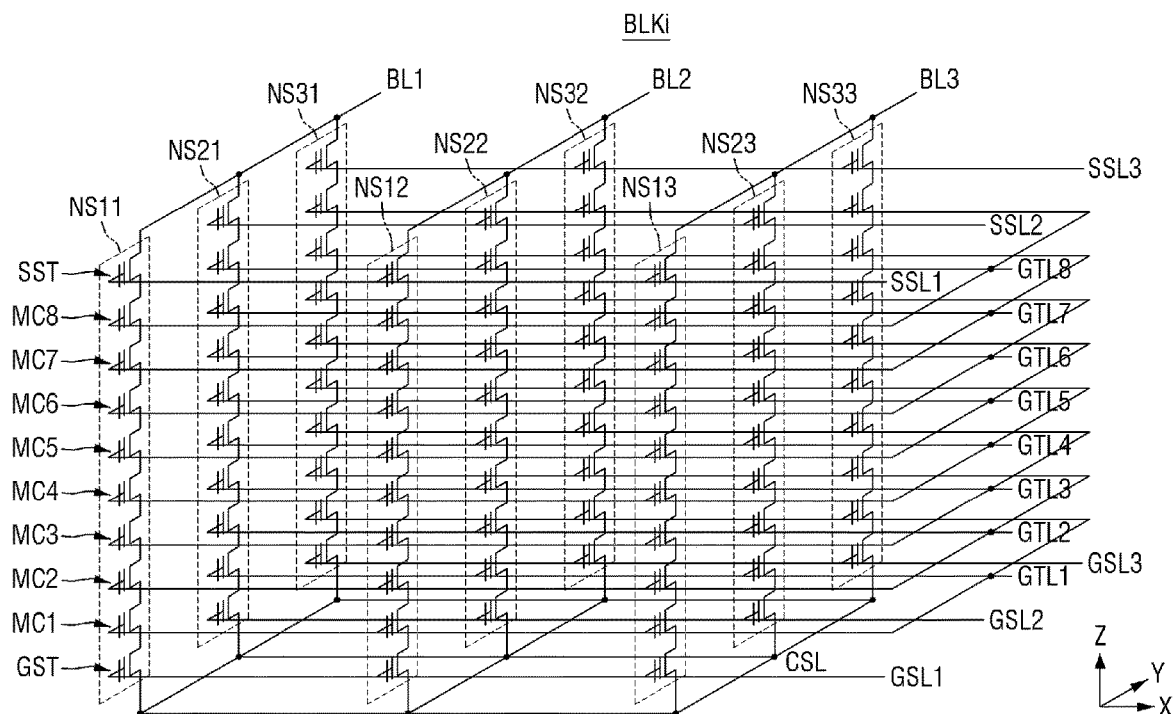
FIG. 11 is a diagram illustrating a three-dimensional (3D) vertical (V)-NAND structure which may be applied to nonvolatile memory chips according to some exemplary embodiments of the present disclosure.

FIG. 11 is a diagram illustrating a 3-dimension (3D) vertical NAND (VNAND) structure which may be applied to the nonvolatile memory chips according to some exemplary embodiments of the present disclosure. When the nonvolatile memory chips according to some exemplary embodiments are implemented as a 3D VNAND flash memory, each of a plurality of memory blocks constituting the nonvolatile memory chip may be represented as an equivalent circuit as shown in FIG. 11.

A memory block BLKi shown in FIG. 1I represents a 3D memory block formed in a 3D structure on a substrate. For example, a plurality of NAND memory strings included in the memory block BLKi may be formed in a direction perpendicular to the substrate.

Referring to FIG. 11, the memory block BLKi may include a plurality of memory NAND strings NS11 to NS31, NS12 to NS32, and NS13 to NS33 connected between bit lines BL1, BL2, and BL3 and a common source line CSL. Each of the plurality of NAND memory strings NS11 to NS31, NS12 to NS32, and NS13 to NS33 may include a string select transistor SST, a plurality of memory cells MC1, MC2, . . . , and MC8, and a ground select transistor GST. FIG. 11 shows that each of the plurality of NAND memory strings NS11 to NS31, NS12 to NS32, and NS13 to NS33 includes eight memory cells MC1, MC2, . . . , and MC8, but the number of memory cells included in each of the plurality of NAND memory strings NS11 to NS31, NS12 to NS32, and NS13 to NS33 is not limited thereto.

The string select transistor SST may be connected to a corresponding string select line SSL1, SSL2, or SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines, and some thereof may correspond to dummy word lines. The ground select transistor GST may be connected to a corresponding ground select line GSL1, GSL2, or GSL3. The string select transistor SST may be connected to a corresponding bit line BL1, BL2 or BL3, and the ground select transistor GST may be connected to the common source line CSL.

The memory cells at the same height may be connected in common to a word line (e.g., WL1), and the ground select lines GSL1, GSL2, and GSL3 and the string select lines SSL1, SSL2, and SSL3 may be separated. Although FIG. 11 shows that the memory block BLKi is connected to the eight gate lines GTL1, GTL2, . . . , and GTL8 and the three bit lines BL1, BL2, and BL3, the number and types of lines connected to the memory block BLKi are not limited thereto.

Figure 12:
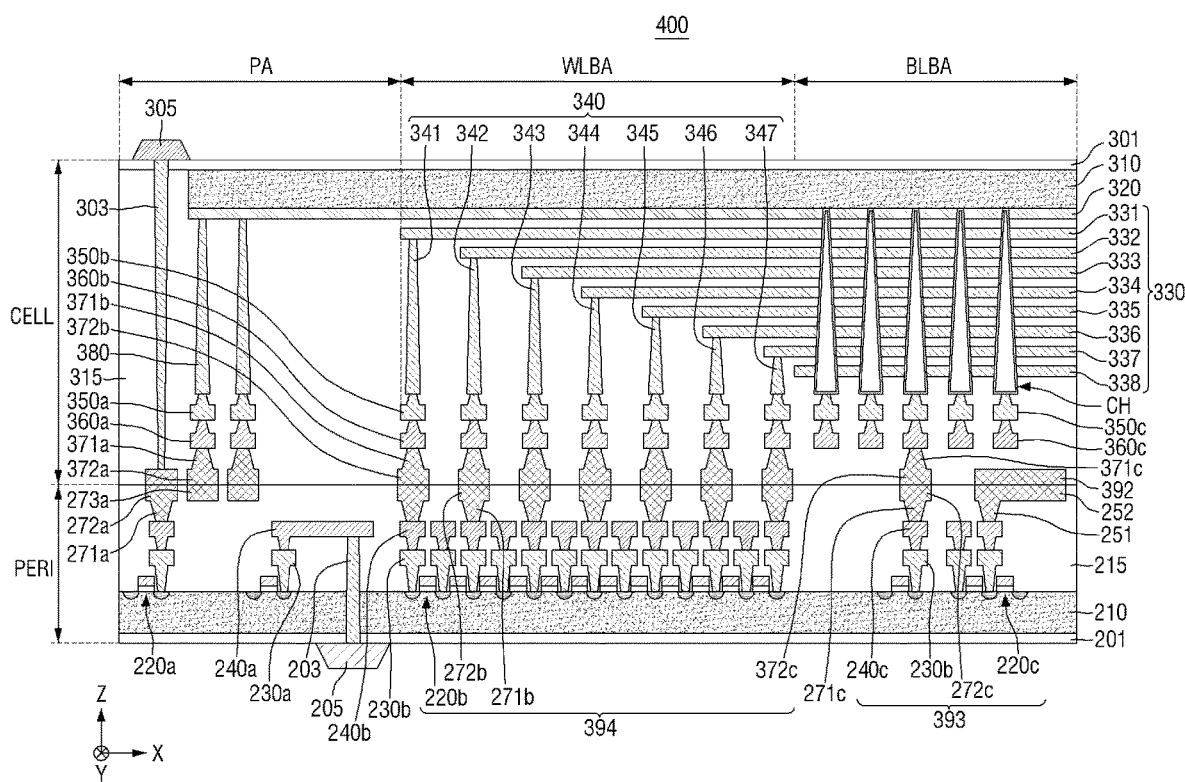
FIG. 12 is a cross-sectional view illustrating a bitwise vertical NAND (BVNAND) structure which may be applied to the nonvolatile memory chip according to some exemplary embodiments of the present disclosure.

FIG. 12 is a cross-sectional view illustrating a bitwise vertical NAND (BVNAND) structure which may be applied to the nonvolatile memory chip according to some exemplary embodiments of the present disclosure.

Referring to FIG. 12, a memory device 400 may have a chip to chip (C2C) structure. The memory device 400 may correspond to one of the nonvolatile memory chips NVM11 to NVM1n and NVM21 to NVM2n in FIG. 1. The C2C structure may be formed by manufacturing an upper chip including a cell area CELL on a first wafer, manufacturing a lower chip including a peripheral circuit area PERI on a second wafer, which differs from the first wafer, and connecting the upper chip and the lower chip to each other by a bonding method. As an example, the bonding method may denote a method of electrically connecting a bonding metal formed in the uppermost metal layer of the upper chip and a bonding metal formed in the uppermost metal layer of the lower chip to each other. For example, when the bonding metals are formed of copper (Cu), the bonding method may be a Cu—Cu bonding method, and the bonding metals may also be formed of aluminum or tungsten.

Each of the peripheral circuit area PERI and the cell area CELL of the memory device 400 may include an external pad bonding area PA, a word line bonding area WLBA, and a bit line bonding area BLBA.

The peripheral circuit area PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. Each of the circuit elements 220a, 220b, and 220c may include one or more transistors. In an exemplary embodiment, the first metal layers 230a, 230b, and 230c may be formed of tungsten which has relatively high resistance, and the second metal layers 240a, 240b, and 240c may be formed of copper which has relatively low resistance.

In an example embodiment illustrate in FIG. 12, only the first metal layers 230a, 230b, and 230c and the second metal layers 240a, 240b, and 240c are illustrated and described. However, the present disclosure is not limited thereto, and one or more metal layers may be formed on the second metal layers 240a, 240b, and 240c. At least some of the one or more metal layers formed on the second metal layers 240a, 240b, and 240c may be formed of aluminum or the like having lower resistance than copper of which the second metal layers 240a, 240b, and 240c are formed.

The interlayer insulating layer 215 may be disposed on the first substrate 210 to cover the plurality of circuit elements 220a, 220b, and 220c, the first metal layers 230a, 230b, and 230c, and the second metal layers 240a, 240b, and 240c and may include an insulating material such as silicon oxide, silicon nitride, or the like.

Lower bonding metals 271b and 272b may be formed on the second metal layers 240b of the word line bonding area WLBA. In the word line bonding area WLBA, the lower bonding metals 271b and 272b of the peripheral circuit area PERI and upper bonding metals 371b and 372b of the cell area CELL may be electrically connected to each other by the bonding method, and the lower bonding metals 271b and 272b and the upper bonding metals 371b and 372b may be formed of aluminum, copper, tungsten, or the like.

The cell area CELL may provide at least one memory block. The cell area CELL may include a second substrate 310 and a common source line 320. On the second substrate 310, a plurality of word lines 331 to 338 (330) may be stacked in a direction (z-axis direction) perpendicular to the upper surface of the second substrate 310. String select lines and ground select lines may be disposed on and under the word lines 330, and the plurality of word lines 330 may be disposed between the string select lines and the ground select lines.

In the bit line bonding area BLBA, channel structures CH may extend in the direction perpendicular to the upper surface of the second substrate 310 and pass through the word lines 330, the string select lines, and the ground select lines. The channel structures CH may include a data storage layer, a channel layer, a buried insulating layer, etc., and the channel layer may be electrically connected to first metal layers 350c and second metal layers 360c. For example, the first metal layers 350c may be bit line contacts, and the second metal layers 360c may be bit lines. In the exemplary embodiment, the bit line 360c may extend in a first direction (y-axis direction) which is parallel to the upper surface of the second substrate 310.

In the exemplary embodiment shown in FIG. 12, an area in which the channel structures CH, the bit lines 360c, etc. are disposed may be defined as the bit line bonding area BLBA. In the bit line bonding area BLBA, the bit lines 360c may be electrically connected to the circuit elements 220c which provide a page buffer 393 in the peripheral circuit area PERI. For example, in the peripheral circuit area PERI, the bit lines 360c may be connected to upper bonding metals 371c and 372c, and the upper bonding metals 371c and 372c may be connected to lower bonding metals 271 and 272c which are connected to the circuit elements 220c of the page buffer 393.

In the word line bonding area WLBA, the word lines 330 may extend in a second direction (x-axis direction) parallel to the upper surface of the second substrate 310 and may be connected to a plurality of cell contact plugs 341 to 347 (340). The word lines 330 and the cell contact plugs 340 may be connected to each other at pads which are provided by at least some of the word lines 330 extending in the second direction at different lengths. First metal layers 350b and second metal layers 360b may be sequentially connected onto the cell contact plugs 340 which are connected to the word lines 330. In the word line bonding area WLBA, the cell contact plugs 340 may be connected to the peripheral circuit area PERI through the upper bonding metals 371b and 372*b* of the cell area CELL and the lower bonding metals 271*b* and 272*b* of the peripheral circuit area PERI.

The cell contact plugs 340 may be electrically connected to the circuit elements 220*b* which provide a row decoder 394 in the peripheral circuit area PERI. In the exemplary embodiment, an operating voltage of the circuit elements 220*b* which provide the row decoder 394 may differ from an operating voltage of the circuit elements 220*c* which provide the page buffer 393. For example, the operating voltage of the circuit elements 220*c* which provide the page buffer 393 may be higher than the operating voltage of the circuit elements 220*b* which provide the row decoder 394.

In the external pad bonding area PA, common source line contact plugs 380 may be disposed. The common source line contact plugs 380 may be formed of a conductive material, such as a metal, a metal compound, or polysilicon, and may be electrically connected to the common source line 320. First metal layers 350*a* and second metal layers 360*a* may be sequentially stacked on the common source line contact plugs 380. For example, an area in which the common source line contact plugs 380, the first metal layers 350*a*, and the second metal layers 360*a* are disposed may be defined as the external pad bonding area PA.

In the external pad bonding area PA, input/output pads 205 and 305 may be disposed. Referring to FIG. 12, a lower insulating film 201 may be formed under the first substrate 210 to cover the lower surface of the first substrate 210, and the first input/output pad 205 may be formed on the lower insulating film 201. The first input/output pad 205 may be connected to at least one of the plurality of circuit elements 220*a*, 220*b*, and 220*c* disposed in the peripheral circuit area PERI through a first input/output contact plug 203 and may be separated from the first substrate 210 by the lower insulating film 201. Also, a lateral insulating film may be disposed between the first input/output contact plug 203 and the first substrate 210 such that the first input/output contact plug 203 and the first substrate 210 may be electrically separated.

Referring to FIG. 12, an upper insulating film 301 covering the upper surface of the second substrate 310 may be formed on the second substrate 310, and the second input/output pad 305 may be disposed on the upper insulating film 301. The second input/output pad 305 may be connected to at least one of the plurality of circuit elements 220*a*, 220*b*, and 220*c* disposed in the peripheral circuit area PERI through a second input/output contact plug 303.

According to the exemplary embodiments, the second substrate 310, the common source line 320, etc. may not be disposed in an area in which the second input/output contact plug 303 is disposed. Also, the second input/output pad 305 may not overlap the word lines 330 in a third direction (z-axis direction). Referring to FIG. 12, the second input/output contact plug 303 may be separated from the second substrate 310 in a direction parallel to the upper surface of the second substrate 310 and may pass through an interlayer insulating layer 315 of the cell area CELL to be connected to the second input/output pad 305.

According to the exemplary embodiments, the first input/output pad 205 and the second input/output pad 305 may be selectively formed. As an example, the memory device 400 may only include the first input/output pad 205 disposed on the first substrate 210 or the second input/output pad 305 disposed on the second substrate 310. Alternatively, the memory device 400 may include both the first input/output pad 205 and the second input/output pad 305.

In each of the external pad bonding area PA and the bit line bonding area BLBA included in each of the cell area CELL and the peripheral circuit area PERI, a metal pattern of the uppermost metal layer may be present as a dummy pattern, or the uppermost metal layer may be empty.

In the external pad bonding area PA of the memory device 400, a lower metal pattern 273*a*, which has the same shape as an upper metal pattern 372*a* of the cell area CELL, may be formed at the uppermost metal layer of the peripheral circuit area PERI to correspond to the upper metal pattern 372*a* formed at the uppermost metal layer of the cell area CELL. The lower metal pattern 273*a* formed at the uppermost metal layer of the peripheral circuit area PERI may not be connected to any contact in the peripheral circuit area PERI. Similarly, in the external pad bonding area PA, an upper metal pattern, which has the same shape as a lower metal pattern of the peripheral circuit area PERI, may be formed at an upper metal layer of the cell area CELL to correspond to the lower metal pattern formed at the uppermost metal layer of the peripheral circuit area PERI.

On the second metal layers 240*b* of the word line bonding area WLBA, the lower bonding metals 271*b* and 272*b* may be formed. In the word line bonding area WLBA, the lower bonding metals 271*b* and 272*b* of the peripheral circuit area PERI and the upper bonding metals 371*b* and 372*b* of the cell area CELL may be electrically connected to each other by the bonding method.

Also, in the bit line bonding area BLBA, an upper metal pattern 392, which has the same shape as a lower metal pattern 252 of the peripheral circuit area PERI, may be formed at the uppermost metal layer of the cell area CELL to correspond to the lower metal pattern 252 formed at the uppermost metal layer of the peripheral circuit area PERI. A contact may not be formed on the upper metal pattern 392 formed at the uppermost metal layer of the cell area CELL.

Figure 13:
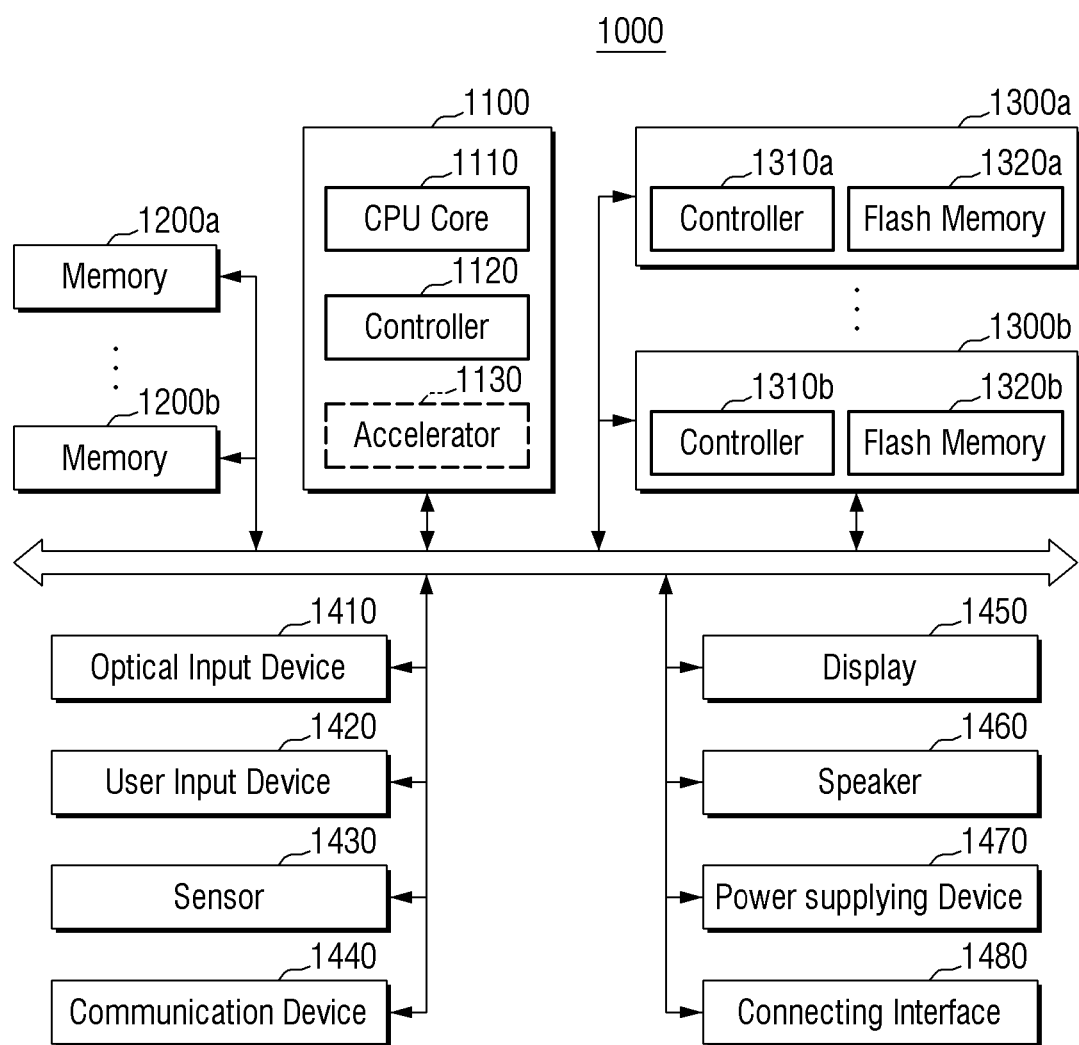
FIG. 13 is a block diagram illustrating a system to which the memory system according to some exemplary embodiments of the present disclosure is applied.

FIG. 13 is a block diagram illustrating a system to which the memory system according to some exemplary embodiments of the present disclosure is applied.

Referring to FIG. 13, a system 1000 to which the memory system according to some exemplary embodiments of the present disclosure is applied may basically be a mobile system such as a mobile phone, a smart phone, a tablet personal computer (PC), a wearable device, a healthcare device, or an Internet of things (IOT) device. However, the system 1000 of FIG. 13 is not necessarily limited to a mobile system and may be a PC, a laptop computer, a server, a media player, an automotive device, such as a navigation device, or the like.

Referring to FIG. 13, the system 1000 may include a main processor 1100, memories 1200*a* and 1200*b*, and storage devices 1300*a* and 1300*b* and may additionally include at least one of an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, more specifically, the operations of other elements of the system 1000. The main processor 1100 may be implemented as a general-purpose processor, a dedicated processor, an application processor, or the like.

The main processor 1100 may include one or more central processing unit (CPU) cores 1110 and may further include a controller 1120 for controlling the memories 1200*a* and 1200*b* and/or the storage devices 1300*a* and 1300*b*. According to the exemplary embodiments, the main processor 1100 may further include an accelerator block 1130 which is a dedicated circuit for high-speed data operations such as artificial intelligence (AI) data operations. The accelerator block 1130 may include a graphics processing unit (GPU), a neural processing unit (NPU), a data processing unit (DPU), and/or the like and may be implemented as a separate chip which is physically independent of other elements of the main processor 1100.

The memories 1200a and 1200b may be used as main storage devices of the system 1000 and may include volatile memories such as a static random access memory (SRAM), a dynamic random access memory (DRAM), and/or the like. However, the memories 1200a and 1200b may include nonvolatile memories such as flash memories, PRAMs, RRAMs, and/or the like. The memories 1200a and 1200b may be implemented in the same package as the main processor 1100.

The storage devices 1300a and 1300b may function as nonvolatile storage devices which store data regardless of whether power is supplied and may have a larger storage capacity than the memories 1200a and 1200b. The storage devices 1300a and 1300b may correspond to the memory system 10 described above with reference to FIGS. 1 to 10.

The storage devices 1300a and 1300b may be physically separated from the main processor 1100 and included in the system 1000 or may be implemented in the same package as the main processor 1100. Also, the storage devices 1300a and 1300b may have a form, such as a solid state drive (SSD) or a memory card, and thus may be coupled to other elements of the system 1000 in a removable manner through an interface such as the connecting interface 1480 which will be described below. The storage devices 1300a and 1300b may be devices to which a standard protocol, such as universal flash storage (UFS), embedded multimedia card (eMMC), or nonvolatile memory express (NVMe), is applied, but the storage devices 1300a and 1300b are not necessarily limited thereto.

The image capturing device 1410 may capture a still image or a moving image and may be a camera, a camcorder, and/or a webcam.

The user input device 1420 may receive various types of data input from a user of the system 1000 and may be a touch pad, a keypad, a keyboard, a mouse, a microphone, and/or the like.

The sensor 1430 may sense various types of physical quantities which may be acquired from the outside of the system 1000 and convert the sensed physical quantities into electrical signals. The sensor 1430 may be a temperature sensor, a pressure sensor, an illumination sensor, a location sensor, an acceleration sensor, a biosensor, a gyroscope, and/or the like.

The communication device 1440 may transmit and receive signals to and from other devices outside the system 1000 according to various communication protocols. The communication device 1440 may be implemented by including an antenna, a transceiver, a modem, and/or the like.

The display 1450 and the speaker 1460 may function as output devices which output visual information and auditory information to the user, respectively.

The power supplying device 1470 may appropriately convert power supplied from an embedded battery (not shown) and/or an external power supply and supply the converted power to each of the elements of the system 1000.

The connecting interface 1480 may provide a connection between the system 1000 and an external device which is connected to the system 1000 to transmit and receive data to and from the system 1000. The connecting interface 1480 may be implemented according to various interfaces such as an advanced technology attachment (ATA) interface, a serial ATA (SATA) interface, an external SATA (e-SATA) interface, a small computer small interface (SCSI) interface, a serial attached SCSI (SAS) interface, a peripheral component interconnection (PCI) interface, a PCI express (PCI-E) interface, an NVMe interface, an Institute of Electrical and Electronics Engineers (IEEE) 1394 interface, a universal serial bus (USB) interface, a secure digital (SD) card interface, an MMC interface, an eMMC interface, a UFS interface, an embedded UFS (eUFS) interface, a compact flash (CF) card interface, and the like.

Figure 14:
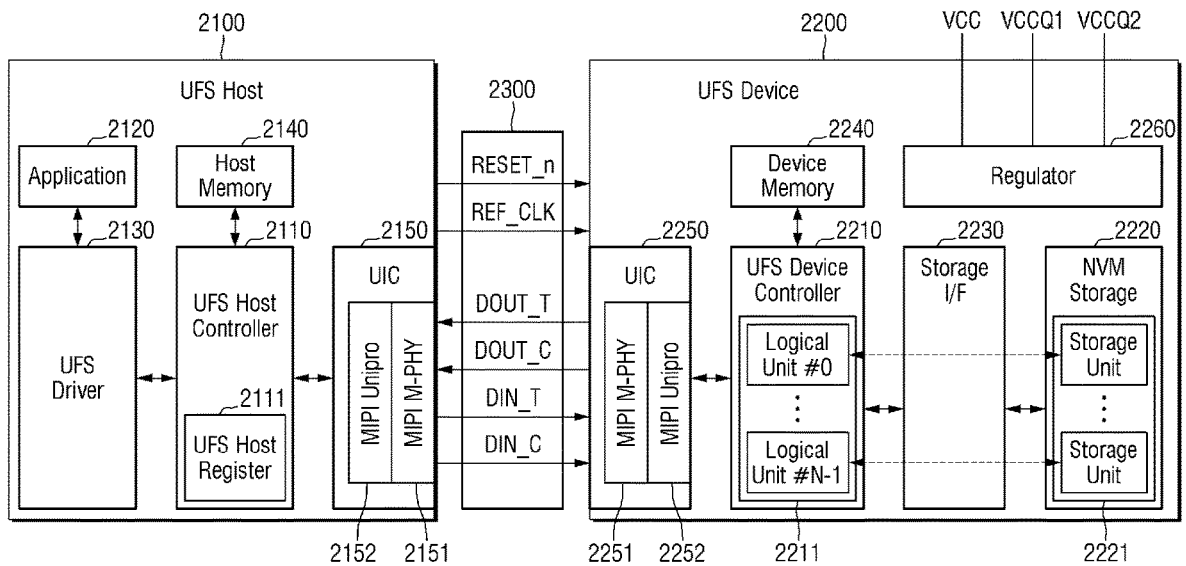
FIG. 14 is a block diagram illustrating a universal flash storage (UFS) system according to some exemplary embodiments of the present disclosure.

FIG. 14 is a block diagram illustrating a universal flash storage (UFS) system according to some exemplary embodiments of the present disclosure. A UFS system 2000 complies with a UFS standard announced by the Joint Electron Device Engineering Council (JEDEC) and may include a UFS host 2100, a UFS device 2200, and a UFS interface 2300. The above description of the system 1000 of FIG. 13 may also apply to the UFS system 2000 of FIG. 14 as long as it does not conflict with the following description of FIG. 14.

Referring to FIG. 14, the UFS host 2100 and the UFS device 2200 may be connected to each other through the UFS interface 2300. When the main processor 1100 of FIG. 13 is an application processor, the UFS host 2100 may be implemented as a part of the application processor. A UFS host controller 2110 and a host memory 2140 may correspond to the controller 1120 and the memories 1200a and 1200b of FIG. 13, respectively. The UFS device 2200 may correspond to the storage devices 1300a and 1300b of FIG. 13, and a UFS device controller 2210 and a nonvolatile memory 2220 may correspond to the storage controllers 1310a and 1310b and the nonvolatile memories 1320a and 1320b of FIG. 13, respectively.

The UFS host 2100 may include the UFS host controller 2110, an application 2120, a UFS driver 2130, the host memory 2140, and a UFS interconnect (UIC) layer 2150. The UFS device 2200 may include the UFS device controller 2210, the nonvolatile memory 2220, a storage interface 2230, a device memory 2240, a UIC layer 2250, and a regulator 2260. The nonvolatile memory 2220 may include a plurality of memory units 2221. The memory units 2221 may include VNAND flash memories having a two-dimensional (2D) structure or a 3D structure or include other kinds of nonvolatile memories such as PRAMs and/or RRAMs. The UFS device controller 2210 and the nonvolatile memory 2220 may be connected to each other through the storage interface 2230. The storage interface 2230 may be implemented to conform to a standard protocol such as Toggle or ONFI. The nonvolatile memory 2220 may correspond to the nonvolatile memory package 100 described above with reference to FIGS. 1 to 10.

The application 2120 may mean a program which requires communication with the UFS device 2200 to use a function of the UFS device 2200. The application 2120 may transmit an input-output request (IOR) to the UFS driver 2130 for an input and/or output for the UFS device 2200. The IOR may mean a data read request, a data write request, a data discard request, and/or the like but is not necessarily limited thereto.

The UFS driver 2130 may manage the UFS host controller 2110 through a UFS-host controller interface (HCI). The UFS driver 2130 may convert the IOR generated by the application 2120 into a UFS command defined in the UFS standard and transmit the converted UFS command to the UFS host controller 2110. One IOR may be converted into a plurality of UFS commands. Basically, the UFS commands may be commands defined in an SCSI standard but may be UFS standard-only commands.

The UFS host controller 2110 may transmit the UFS command converted by the UFS driver 2130 to the UIC layer 2250 of the UFS device 2200 through the UIC layer 2150 and the UFS interface 2300. In this process, a UFS host register 2111 of the UFS host controller 2110 may serve as a command queue (CQ).

The UIC layer 2150 of the UFS host 2100 may include a mobile industry processor interface (MIPI) M-PHY 2151 and an MIPI UniPro 2152, and the UIC layer 2250 of the UFS device 2200 may also include an MIPI M-PHY 2251 and an MIPI UniPro 2252.

The UFS interface 2300 may include a line for transmitting a reference clock REF_CLK, a line for transmitting a hardware reset signal RESET_n for the UFS device 2200, one pair of lines for transmitting a pair of differential input signals DIN_T and DIN_C, and one pair of lines for transmitting a pair of differential output signals DOUT_T and DOUT_C.

The frequency of the reference clock REF_CLK provided from the UFS host 2100 to the UFS device 2200 may have one of four values 19.2 MHz, 26 MHz, 38.4 MHz, and 52 MHz but is not necessarily limited thereto. Even during operation, that is, while data is transmitted and received between the UFS host 2100 and the UFS device 2200, the UFS host 2100 may change the frequency value of the reference clock REF_CLK. The UFS device 2200 may generate clocks having various frequencies from the reference clock REF_CLK received from the UFS host 2100 using a phase-locked loop (PLL) and the like. Also, the UFS host 2100 may set a data rate value between the UFS host 2100 and the UFS device 2200 through the frequency value of the reference clock REF_CLK. For example, the data rate value may be determined depending on the frequency value of the reference clock REF_CLK.

The UFS interface 2300 may support a plurality of lanes, and each of the lanes may be implemented as a differential pair. For example, the UFS interface 2300 may include one or more receive lanes and one or more transmit lanes. In FIG. 14, one pair of lines for transmitting the pair of differential input signals DIN_T and DIN_C may be the receive lanes, and one pair of lines for transmitting the pair of differential output signals DOUT_T and DOUT_C may be the transmit lanes. Although FIG. 14 shows one transmit lane and one receive lane, the number of transmit lanes and the number of receive lanes may be changed.

The receive lanes and the transmit lanes may transmit data in a serial communication manner, and full-duplex communication is possible between the UFS host 2100 and the UFS device 2200 due to a structure in which the receive lanes are separated from the transmit lanes. In other words, the UFS device 2200 can transmit data to the UFS host 2100 through the transmit lanes even while receiving data from the UFS host 2100 through the receive lanes. Also, control data, such as a command from the UFS host 2100 to the UFS device 2200, and user data, which will be stored in the nonvolatile memory 2220 of the UFS device 2200 or read from the nonvolatile memory 2220 by the UFS host 2100, may be transmitted through the same lane. Accordingly, a lane for transmitting data is unnecessary between the UFS host 2100 and the UFS device 2200 except for one pair of receive lanes and one pair of transmit lanes.

The UFS device controller 2210 of the UFS device 2200 may control the overall operation of the UFS device 2200. The UFS device controller 2210 may manage the nonvolatile memory 2220 through logical units (LUs) 2211 which are logical data storage units. The number of LUs 2211 may be eight but is not limited thereto. The UF S device controller 2210 may include a flash translation layer (FTL) and translate a logical data address received from the UFS host 2100, for example, a logical block address (LBA), into a physical data address, for example, a physical block address (PBA), using address mapping information of the FTL. In the UFS system 2000, logical blocks for storing user data may have a certain range of size. For example, the minimum size of logical blocks may be set to 4K bytes.

When a command from the UFS host 2100 is input to the UFS device 2200 through the UIC layer 2250, the UFS device controller 2210 may perform an operation according to the input command. When the operation is completed, the UFS device controller 2210 may transmit a completion response to the UFS host 2100.

As an example, when the UFS host 2100 tries to store user data in the UFS device 2200, the UFS host 2100 may transmit a data write command to the UFS device 2200. When a ready-to-transfer response is received from the UFS device 2200, the UFS host 2100 may transmit the user data to the UFS device 2200. The UFS device controller 2210 may temporarily store the received user data in the device memory 2240 and store the user data temporarily stored in the device memory 2240 in a selected location in the nonvolatile memory 2220 on the basis of address mapping information of the FTL.

As another example, when the UFS host 2100 tries to read user data stored in the UFS device 2200, the UFS host 2100 may transmit a data read command to the UFS device 2200. The UFS device controller 2210 receiving the command may read the user data from the nonvolatile memory 2220 on the basis of the data read command and temporarily store the read user data in the device memory 2240. In this read process, the UFS device controller 2210 may detect and correct an error in the read user data using an embedded error correction code (ECC) engine (not shown). More specifically, the ECC engine may generate parity bits for write data to be written to the nonvolatile memory 2220, and the generated parity bits may be stored in the nonvolatile memory 2220 together with the write data. When data is read from the nonvolatile memory 2220, the ECC engine may correct an error in the read data using the parity bits, which are read from the nonvolatile memory 2220 together with the read data, and output the read data in which the error has been corrected.

The UFS device controller 2210 may transmit the user data temporarily stored in the device memory 2240 to the UFS host 2100. Also, the UFS device controller 2210 may further include an advanced encryption standard (AES) engine (not shown). The AES engine may perform at least one of an encryption operation and a decryption operation for data input to the UFS device controller 2210 using a symmetric-key algorithm.

The UFS host 2100 may sequentially store commands to be transmitted to the UFS device 2200 in the UFS host register 2111, which may function as a CQ, and transmit the commands to the UFS device 2200 in the sequence. At this time, even while a previously transmitted command is still being processed by the UFS device 2200, that is, even before the UFS host 2100 is notified that the previously transmitted command has been completely processed by the UFS device 2200, the UFS host 2100 can transmit a subsequent command waiting in the CQ to the UFS device 2200. Accordingly, the UFS device 2200 can also receive the subsequent command from the UFS host 2100 even while processing the previously transmitted command. The maximum number of commands that may be stored in the CQ, that is, a queue depth, may be 32 by way of example. Also, the CQ may be implemented as a circular queue type which represents the start and end of a command string stored in the queue through a head pointer and a tail pointer, respectively.

Each of the plurality of memory units 2221 may include a memory cell array (not shown) and a control circuit (not shown) which controls the operation of the memory cell array. The memory cell array may include a 2D memory cell array or a 3D memory cell array. The memory cell array includes a plurality of memory cells, and each of the memory cells may be a single level cell (SLC) which stores information of one bit or a cell which stores information of two or more bits such as a multilevel cell (MLC), a triple level cell (TLC), or a quadruple level cell (QLC). The 3D memory cell array may include a vertical NAND string which is vertically oriented so that at least one memory cell may be placed on another memory cell.

As power supply voltages, voltages VCC, VCCQ, VCCQ2, etc. may be input to the UFS device 2200. The voltage VCC is a main power supply voltage for the UFS device 2200 and may have a value of 2.4 V to 3.6 V. The voltage VCCQ is a power supply voltage for supplying a low range of voltage and mainly intended for the UFS device controller 2210. The voltage VCCQ may have a value of 1.14 V to 1.26 V. The voltage VCCQ2 is a power supply voltage for supplying a range of voltage which is lower than VCC but higher than the voltage VCCQ and mainly intended for an input/output interface such as the MIPI M-PHY 2251. The voltage VCCQ2 may have a value of 1.7 V to 1.95 V. The power supply voltages may be supplied to each element of the UFS device 2200 through the regulator 2260. The regulator 2260 may be implemented as a set of regulators which are separately connected to the above-described power supply voltages.

Figure 15:
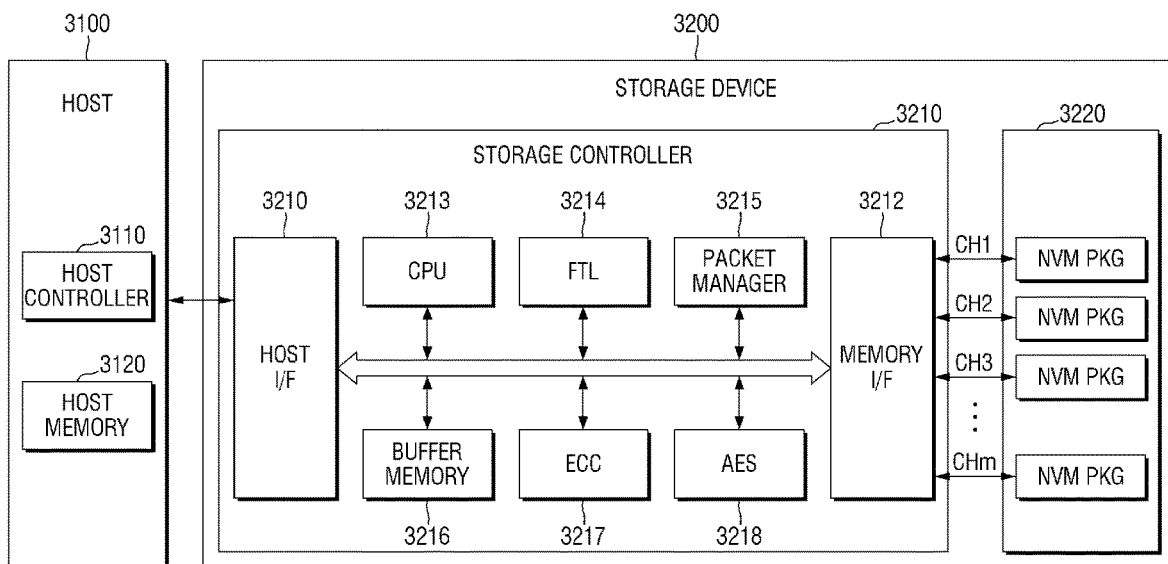
FIG. 15 is a block diagram illustrating a host-storage system according to some exemplary embodiments of the present disclosure.

FIG. 15 is a block diagram illustrating a host-storage system according to some exemplary embodiments of the present disclosure.

The host-storage system 3000 may include a host 3100 and a storage device 3200. The storage device 3200 may include a storage controller 3210 and a nonvolatile memory 3220. According to the exemplary embodiment, the host 3100 may include a host controller 3110 and a host memory 3120. The host memory 3120 may function as a buffer memory for temporarily storing data to be transmitted to the storage device 3200 or data transmitted from the storage device 3200.

The storage device 3200 may include storage media for storing data according to a request from the host 3100. As an example, the storage device 3200 may include at least one of an SSD, an embedded memory, and a removable external memory. When the storage device 3200 is an SSD, the storage device 3200 may be a device conforming to an NVMe standard. When the storage device 3200 is an embedded memory or an external memory, the storage device 3200 may be a device conforming to a UFS or eMMC standard. Each of the host 3100 and the storage device 3200 may generate and transmit packets conforming to the employed standard protocol.

The nonvolatile memory 3220 of the storage device 3200 may correspond to the nonvolatile memory package 100 described above with reference to FIGS. 1 to 10.

According to the exemplary embodiment, the host controller 3110 and the host memory 3120 may be implemented as separate semiconductor chips. Alternatively, the host controller 3110 and the host memory 3120 may be integrated into the same semiconductor chip. As an example, the host controller 3110 may be any one of a plurality of modules provided in an application processor, which may be implemented as a system on chip (SoC). Also, the host memory 3120 may be an embedded memory provided in the application processor or a nonvolatile memory or a memory module disposed outside the application processor.

The host controller 3110 may manage an operation of storing data of the host memory 3120 (e.g., write data) in the nonvolatile memory 3220 or storing data of the nonvolatile memory 3220 (e.g., read data) in the host memory 3120.

The storage controller 3210 may include a host interface 3210, a memory interface 3212, and a CPU 3213. Also, the storage controller 3210 may further include an FTL 3214, a packet manager 3215, a buffer memory 3216, an ECC engine 3217, and an AES engine 3218. The storage controller 3210 may further include a working memory (not shown) onto which the FTL 3214 is loaded, and when the CPU 3213 executes the FTL 3214, data write and read operations for the nonvolatile memory 3220 may be controlled. The storage controller 3210 may correspond to the memory controller 200 described above with reference to FIGS. 1 to 10.

The host interface 3210 may transmit and receive packets to and from the host 3100. The packets transmitted from the host 3100 to the host interface 3210 may include a command, data to be written to the nonvolatile memory 3220, or the like. The packets transmitted from the host interface 3210 to the host 3100 may include a response to the command, data read from the nonvolatile memory 3220, or the like. The memory interface 3212 may transmit data to be written to the nonvolatile memory 3220 to the nonvolatile memory 3220 or receive data read from the nonvolatile memory 3220. The memory interface 3212 may be implemented to conform to a standard protocol such as Toggle or ONFI.

The FTL 3214 may perform various functions such as address mapping, wear-leveling, and garbage collection. Address mapping is an operation of changing a logical address received from the host 3100 into a physical address used to actually store data in the nonvolatile memory 3220. Wear-leveling is a technique for preventing excessive degradation of a specific block by causing blocks in the nonvolatile memory 3220 to be evenly used. For example, wear-leveling may be implemented through a firmware technique for balancing erase counts of physical blocks. Garbage collection is a technique for ensuring an available capacity in the nonvolatile memory 3220 by copying valid data of a block to a new block and then erasing the existing block.

The packet manager 3215 may generate packets conforming to an interface protocol arranged with the host 3100 or parse various kinds of information from packets received from the host 3100. Also, the buffer memory 3216 may temporarily store data to be written to the nonvolatile memory 3220 or data read from the nonvolatile memory 3220. The buffer memory 3216 may be an element provided in the storage controller 3210 but may be disposed outside the storage controller 3210.

The ECC engine 3217 may perform an error detection and correction function on read data which is read from the nonvolatile memory 3220. More specifically, the ECC engine 3217 may generate parity bits for write data to be written to the nonvolatile memory 3220, and the generated parity bits may be stored in the nonvolatile memory 3220 together with the write data. When data is read from the nonvolatile memory 3220, the ECC engine 3217 may correct an error in the read data using the parity bits, which are read from the nonvolatile memory 3220 together with the read data, and output the read data in which the error has been corrected.

The AES engine 3218 may perform at least one of an encryption operation and a decryption operation for data input to the storage controller 3210 using a symmetric-key algorithm.

Although exemplary embodiments of the present disclosure have been described above with reference to the accompanying drawings, the present disclosure is not limited to the embodiments and may be implemented in various different forms. While example embodiments have been illustrated and described above, it will be apparent to those skilled in the art that modifications and variations could be made without departing from the scope of the present disclosure as defined by the appended claims.

What is claimed is:

1. A memory system comprising:
a plurality of nonvolatile memory chips each including a status output pin;
a memory controller including a first pin; and
a buffer chip connected between the plurality of nonvolatile memory chips and the memory controller and including a second pin configured to output an external state signal to the first pin and a third pin configured to receive a plurality of internal state signals, which indicate states of the plurality of nonvolatile memory chips, from the status output pins,
wherein the buffer chip is configured to:
determine a duty cycle of the external state signal on the basis of identifications (IDs) of the plurality of nonvolatile memory chips which output the plurality of internal state signals, and
output the external state signal,
wherein the memory controller is configured to:
determine which of the plurality of nonvolatile memory chips is in a particular state without a status read command, and
provide an input/output command to at least one of the plurality of nonvolatile memory chips, and
wherein the input/output command includes a read command or a write command.

2. The memory system of claim 1, wherein the buffer chip is configured to output the external state signal to the first pin of the memory controller through the second pin every preset period.

3. The memory system of claim 1, wherein, when the input/output command is provided to the memory controller, the memory system is configured such that the buffer chip outputs the external state signal to the first pin of the memory controller through the second pin.

4. The memory system of claim 1, wherein when the input/output command is provided to the memory controller, the memory system is configured such that the at least one of the nonvolatile memory chips outputs a corresponding internal state signal.

5. The memory system of claim 1, wherein each of the plurality of internal state signals indicates any one of a first state and a second state, and
wherein the buffer chip is configured to determine the duty cycle of the external state signal depending on an identification (ID) of a nonvolatile memory chip which outputs an internal state signal indicating the first state among the plurality of nonvolatile memory chips.

6. The memory system of claim 1, wherein:
each of the plurality of nonvolatile memory chips further includes a data pin,
the memory controller further includes a fourth pin which differs from the first pin, and
the buffer chip further includes a fifth pin and a sixth pin, which differ from the second pin and the third pin, and the buffer chip is configured to:
receive data from the data pin of the nonvolatile memory chip, which receives the input/output command, through the sixth pin, and
provide the data to the fourth pin of the memory controller through the fifth pin.

7. The memory system of claim 1, wherein:
the plurality of nonvolatile memory chips include a first nonvolatile memory chip and a second nonvolatile memory chip,
the first nonvolatile memory chip is configured to output a first internal state signal, which indicates a ready state, through the status output pin of the first nonvolatile memory chip at a first time point,
the second nonvolatile memory chip is configured to output a second internal state signal, which indicates the ready state, through the status output pin of the second nonvolatile memory chip at a second time point,
the buffer chip is configured to output the external state signal including a first time section and a second time section, which have a set period, through the second pin, and
the duty cycle of the external state signal is proportional to an identification (ID) of the first nonvolatile memory chip in the first time section and is proportional to an ID of the second nonvolatile memory chip in the second time section.

8. The memory system of claim 7, wherein the first time point is before the second time point, and
wherein the first time section is before the second time section.

9. The memory system of claim 1, wherein:
the states of the plurality of nonvolatile memory chips include a first state, a second state, and a third state which differ from each other,
the plurality of nonvolatile memory chips include a first nonvolatile memory chip which outputs a first internal state signal, and
the buffer chip is configured to:
output the external state signal, which has a set period and includes consecutive first and second time sections, through the second pin on the basis of the first internal state signal, and
determine the duty cycle of the external state signal depending on an identification (ID) of the first nonvolatile memory chip in the first time section and depending on the first to third states in the second time section.

10. The memory system of claim 9, wherein:
the first state is a ready state,
the second state is a busy state, and
the third state is a write error state or a read error state.

11. The memory system of claim 1, wherein:
the states of the plurality of nonvolatile memory chips include a first state, a second state, and a third state which differ from each other,
the plurality of nonvolatile memory chips include a first nonvolatile memory chip which outputs a first internal state signal,
the buffer chip is configured to output the external state signal, which has a set period and includes consecutive first and second time sections, through the second pin on the basis of the first internal state signal, and
the buffer chip is configured to determine the duty cycle of the external state signal depending on the first to third states in the first time section and depending on an identification (ID) of the first nonvolatile memory chip in the second time section.

12. A memory system comprising:
a plurality of nonvolatile memory chips each including a status output pin;
a memory controller; and
a buffer chip connected between the plurality of nonvolatile memory chips and the memory controller, configured to receive a plurality of internal state signals, which indicate states of the plurality of nonvolatile memory chips, from the status output pins, and configured to output an external state signal every set period on the basis of the received internal state signal indicating a particular state among the plurality of internal state signals,
wherein the set period of the external state signal includes a first time section having a first logic level and a second time section having a second logic level,
wherein the external state signal includes a length of the first time section depending on an identification (ID) of a nonvolatile memory chip which outputs the received internal state signal indicating the particular state among the plurality of nonvolatile memory chips, and
wherein the memory controller is configured to:
receive the external state signal from the buffer chip,
determine which of the plurality of nonvolatile memory chips is in the particular state without a status read command,
provide a read command to at least one of the plurality of nonvolatile memory chips through the buffer chip on the basis of the length of the first time section included in the external state signal, and
receive data read from the at least one of the nonvolatile memory chips which receives the read command through the buffer chip.

13. The memory system of claim 12, wherein the memory controller is configured to receive the external state signal from the buffer chip in response to the read command.

14. The memory system of claim 12, wherein:
the plurality of nonvolatile memory chips include n, (n being a natural number), nonvolatile memory chips which receive a clock signal,
the length of the first time section included in the external state signal is n times a period of the clock signal,
the memory controller is configured to provide the read command to a first nonvolatile memory chip among the plurality of nonvolatile memory chips, and
an identification (ID) of the first nonvolatile memory chip is n.

15. The memory system of claim 14, wherein the ID of the first nonvolatile memory chip is set when the memory system is reset or booted.

16. The memory system of claim 12, wherein the memory controller is configured to provide the read command to at least one of the plurality of nonvolatile memory chips through the buffer chip without providing the status read command to the plurality of nonvolatile memory chips through the buffer chip.

17. The memory system of claim 12, wherein:
the plurality of nonvolatile memory chips include n, n being a natural number, nonvolatile memory chips which receive a clock signal, and
the set period of the external state signal is greater than the product of the number of the nonvolatile memory chips and a clock cycle.

18. An operating method of a memory system, comprising:
receiving, by a buffer chip, a plurality of internal state signals, which indicate states of a plurality of nonvolatile memory chips, from the plurality of nonvolatile memory chips; and
outputting, by the buffer chip, one external state signal having a set period to a memory controller on the basis of the plurality of received internal state signals indicating a particular state,
wherein in a first time section of the external state signal having the set period, a duty cycle of the external state signal determines depending on an identification (ID) of the nonvolatile memory chip which outputs the internal state signal indicating the particular state among the plurality of nonvolatile memory chips.

19. The operating method of claim 18, further comprising:
receiving a clock signal at the plurality of nonvolatile memory chips including n, n is being a natural number, nonvolatile memory chips which receive a clock signal,
wherein a length of the first time section is n times a period of the clock signal, and
wherein the ID of the nonvolatile memory chip which outputs the internal state signal indicating the particular state is n.

20. The operating method of claim 18, further comprising:
receiving, at the memory controller, a read command;
providing, by the memory controller, the read command to any one of the plurality of nonvolatile memory chips through the buffer chip on the basis of the external state signal without providing a status read command to the plurality of nonvolatile memory chips through the buffer chip; and
receiving, by the memory controller, data read from at least one of the nonvolatile memory chips which receives the read command through the buffer chip.

* * * * *